United States Patent [19]
Fulford, Jr. et al.

[11] Patent Number: 5,796,143
[45] Date of Patent: Aug. 18, 1998

[54] TRENCH TRANSISTOR IN COMBINATION WITH TRENCH ARRAY

[75] Inventors: H. Jim Fulford, Jr., Austin; Mark I. Gardner, Cedar Creek; Derick J. Wristers, Austin, all of Tex.

[73] Assignee: Advanced Micro Devices, Inc., Sunnyvale, Calif.

[21] Appl. No.: 739,597

[22] Filed: Oct. 30, 1996

[51] Int. Cl.$^6$ .......................... H01L 29/76; H01L 29/94; H01L 31/062; H01L 31/113
[52] U.S. Cl. .......................... 257/330; 257/374
[58] Field of Search .......................... 257/330, 374

[56] References Cited

U.S. PATENT DOCUMENTS

| | | | |
|---|---|---|---|
| 4,745,086 | 5/1988 | Parillo et al. | 437/57 |
| 5,094,973 | 3/1992 | Pang . | |
| 5,141,891 | 8/1992 | Arima et al. | 437/44 |
| 5,166,084 | 11/1992 | Pfiester | 437/40 |
| 5,175,118 | 12/1992 | Yoneda | 437/40 |
| 5,231,038 | 7/1993 | Yamaguchi et al. | 437/40 |
| 5,451,804 | 9/1995 | Lur et al. . | |
| 5,504,031 | 4/1996 | Hsu et al. | 437/57 |
| 5,512,506 | 4/1996 | Chang et al. | 437/44 |
| 5,538,913 | 7/1996 | Hong | 437/44 |
| 5,545,579 | 8/1996 | Liang et al. | 437/44 |
| 5,567,635 | 10/1996 | Acovic et al. | 437/43 |
| 5,574,302 | 11/1996 | Wen et al. . | |
| 5,640,034 | 6/1997 | Malhi . | |

FOREIGN PATENT DOCUMENTS

| | | |
|---|---|---|
| 1-4058 | 1/1989 | Japan . |
| 2-22868 | 1/1990 | Japan . |

*Primary Examiner*—Stephen Meier
*Attorney, Agent, or Firm*—Skjerven, Morrill, MacPherson, Franklin & Friel LLP; David M. Sigmond

[57] ABSTRACT

An IGFET in combination with a trench array is disclosed. A semiconductor substrate includes first and second x-direction trenches and first, second and third y-direction trenches generally orthogonal to intersecting with the x-direction trenches. The x-direction trenches and the first and second y-direction trenches surround a first generally rectangular region of the substrate, the x-direction trenches and the second and third y-direction trenches surround a second generally rectangular region of the substrate, and the second y-direction trench is between the first and second substrate regions. A gate insulator is on a bottom surface of the second y-direction trench, and insulative spacers are adjacent to opposing sidewalls of the second y-direction trench. A gate electrode is on the gate insulator and the spacers, in the y-direction trench, and electrically isolated from the substrate. A source is in the first substrate region and beneath and adjacent to the bottom surface of the second y-direction trench, and a drain is in the second substrate region and beneath and adjacent to the bottom surface of the second y-direction trench. The x-direction trenches and the first and third y-direction trenches are filled with an insulator and provide device isolation for the IGFET. Advantageously, all the trenches are formed simultaneously using a single etch step.

25 Claims, 19 Drawing Sheets

5,796,143

1

TRENCH TRANSISTOR IN COMBINATION WITH TRENCH ARRAY

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and drain. The channel, source and drain are located in a semiconductor substrate, with the substrate being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

The planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

IGFETs are generally electrically isolated from one another in the substrate to prevent spurious channels from forming between them, and selected IGFETs are interconnected by an overlying metallization pattern. An isolation technique termed LOCOS (for LOCalized Oxidation of Silicon) involves the thermal growth of recessed field oxides in field regions between adjacent IGFETs. Prior to growing the field oxides, a thin layer of silicon nitride covers the active regions and exposes the field regions, and ion implantation provides a channel-stop implant that is self-aligned to the field regions. The channel-stop implant increases doping under the field oxides to ensure the threshold voltage of parasitic devices is greater than any operating voltage. Thick field oxides render the channel-stop implant unnecessary, but are generally not used to reduce step coverage problems. For submicron IGFETs, LOCOS-based techniques are often replaced by trench-based isolation schemes. For instance, with shallow trench and refill isolation, a trench on the order of 3000 to 5000 angstroms deep is anisotropically etched into the silicon substrate, a short thermal oxidation is applied to control the interface quality on the trench walls, an insulative material is filled into the trench, and the surface is planarized using chemical-mechanical polishing. Deep trench isolation is also known in the art. Trench-based isolation provides smaller isolation spacing than is possible with LOCOS. In addition, the fully recessed structure provides a planar top surface, and the sharp lower corners provide improved isolation efficiency due to the so called "corner effect." A drawback to trench-based isolation, however, is the need for additional processing steps dedicated solely to forming the trenches.

Accordingly, a need exists for an IGFET that can be manufactured with reduced horizontal dimensions and a substantially planar top surface in conjunction with an efficient technique for providing device isolation. It is especially desirable that the IGFET have a channel length that can be significantly smaller than the minimum resolution of the available lithographic system.

SUMMARY OF THE INVENTION

The present invention provides an insulated-gate field-effect transistor (IGFET) with a gate electrode in a trench (i.e., a trench transistor). The trench is part of a trench array formed in the top surface of a semiconductor substrate. The trench array includes first and second x-direction trenches and first, second and third y-direction trenches generally orthogonal to and intersecting with the x-direction trenches. The x-direction trenches and the first and second y-direction trenches surround a first generally rectangular region of the substrate, the x-direction trenches and the second and third y-direction trenches surround a second generally rectangular region of the substrate, and the second y-direction trench is between the first and second substrate regions. A gate insulator is on the bottom surface of the second y-direction trench, spacers are adjacent to opposing sidewalls of the second y-direction trench, and the gate electrode is on the gate insulator and spacers and in the second y-direction trench. A source in the first substrate region extends beneath the bottom surface of the second y-direction trench, and a drain in the second substrate region extends beneath the bottom surface of the second y-direction trench. If the trench length (or linewidth) of the second y-direction trench (or transistor trench) corresponds to the minimum resolution of a lithographic system, then the channel length is significantly smaller than the minimum resolution. Furthermore, the gate electrode can be substantially aligned with the top surface of the substrate, substantially all of the gate electrode can be within the second y-direction trench, and the other trenches can be filled with an insulator. In this manner, a highly miniaturized IGFET surrounded by isolation trenches can be produced.

A key feature of the invention is simultaneously forming all the trenches using a single etch step, thereby improving process efficiency.

According to one aspect of the invention, a method of forming the IGFET and trench array includes forming all the trenches in the substrate, forming the spacers in the second y-direction trench, forming the gate insulator between the spacers on the bottom surface of the second y-direction trench, forming the gate electrode on the gate insulator and spacers, and forming the source and the drain.

In an embodiment of the method, forming all the trenches is accomplished using a single etch step, forming the spacers includes depositing a first oxide layer over the substrate and into all the trenches and then applying an anisotropic etch that exposes central portions of the bottom surfaces of all the trenches, forming the gate insulator includes growing oxide regions on the central portions of the bottom surfaces of all the trenches, and forming the gate electrode includes depositing a polysilicon layer over the substrate and into all the trenches and then applying polishing until no portion of the polysilicon layer overlaps the top surface of the substrate. The method may also include removing substantially all of the polysilicon in the first and second x-direction trenches and the first and third y-direction trenches without removing the polysilicon in the second y-direction trench, depositing a second oxide layer over the substrate and into the first and second x-direction trenches and the first and third y-direction trenches, and planarizing the second oxide layer so that the first and second x-direction trenches and the first and third y-direction trenches are filled with oxide.

Preferably, the source includes a lightly doped region beneath and adjacent to the bottom surface of the second y-direction trench that provides a first channel junction and a heavily doped region adjacent to the top surface, and the drain includes a lightly doped region beneath and adjacent to the bottom surface of the second y-direction trench that provides a second channel junction and a heavily doped region adjacent to the top surface. The source/drain doping can be provided before, after, or both before and after the trenches are formed. It is also preferred that the trenches have essentially identical linewidths and depths.

A primary advantage of the invention is that the IGFET can have a channel length that is significantly smaller than the minimum resolution of the available lithographic system, thereby providing a next generation transistor with the present generation lithography. In addition, the gate electrode can be substantially aligned with the top surface of the substrate, and the trench array can be formed without additional processing steps. Moreover, the invention is well-suited for forming a plurality of IGFETs in combination with the trench array in which selected gate electrodes and/or source/drain regions can be interconnected without the need for an overlying metallization pattern.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
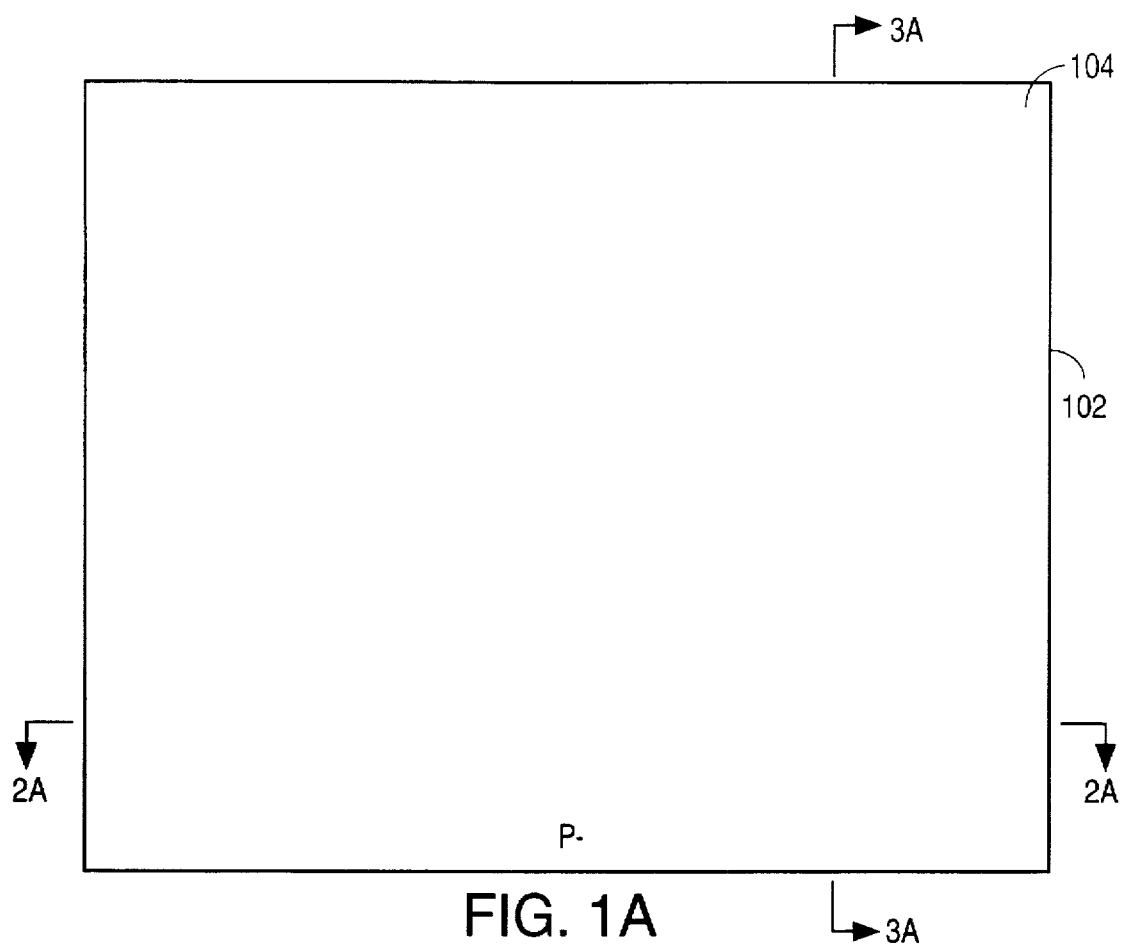
FIGS. 1A–1Q show top plan views of successive process steps for forming a plurality of IGFETs in combination with a trench array in accordance with an embodiment of the invention.

In the drawings, depicted elements are not necessarily drawn to scale and like or similar elements may be designated by the same reference numeral throughout the several views.

Figure 2A:
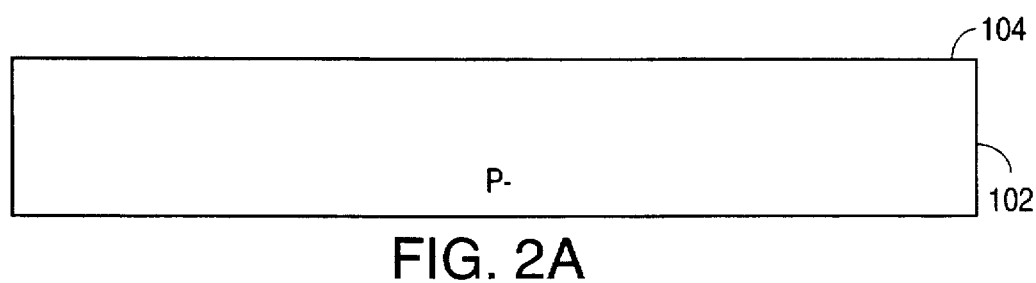
FIGS. 2A–2Q show cross-sectional views taken along lines 2A—2A-2Q—2Q of FIGS. 1A–1Q, respectively.
Figure 1B:
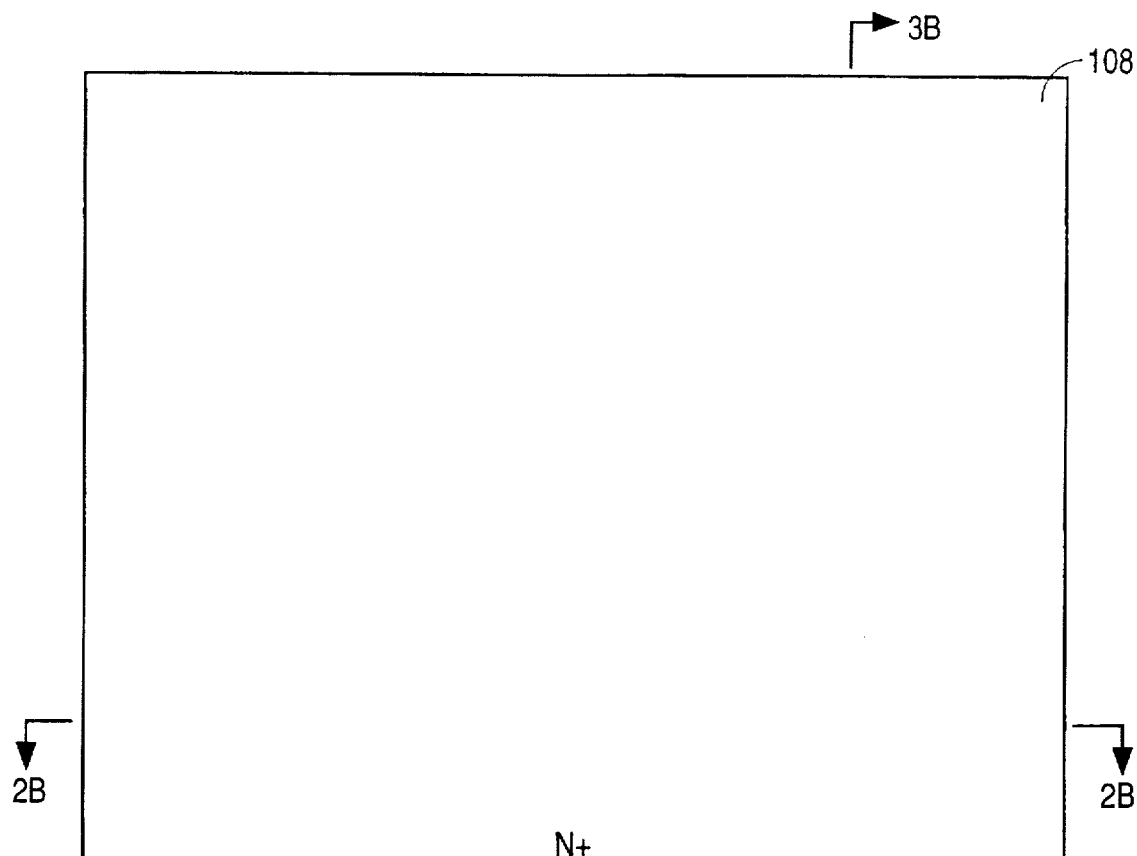
Figure 1C:
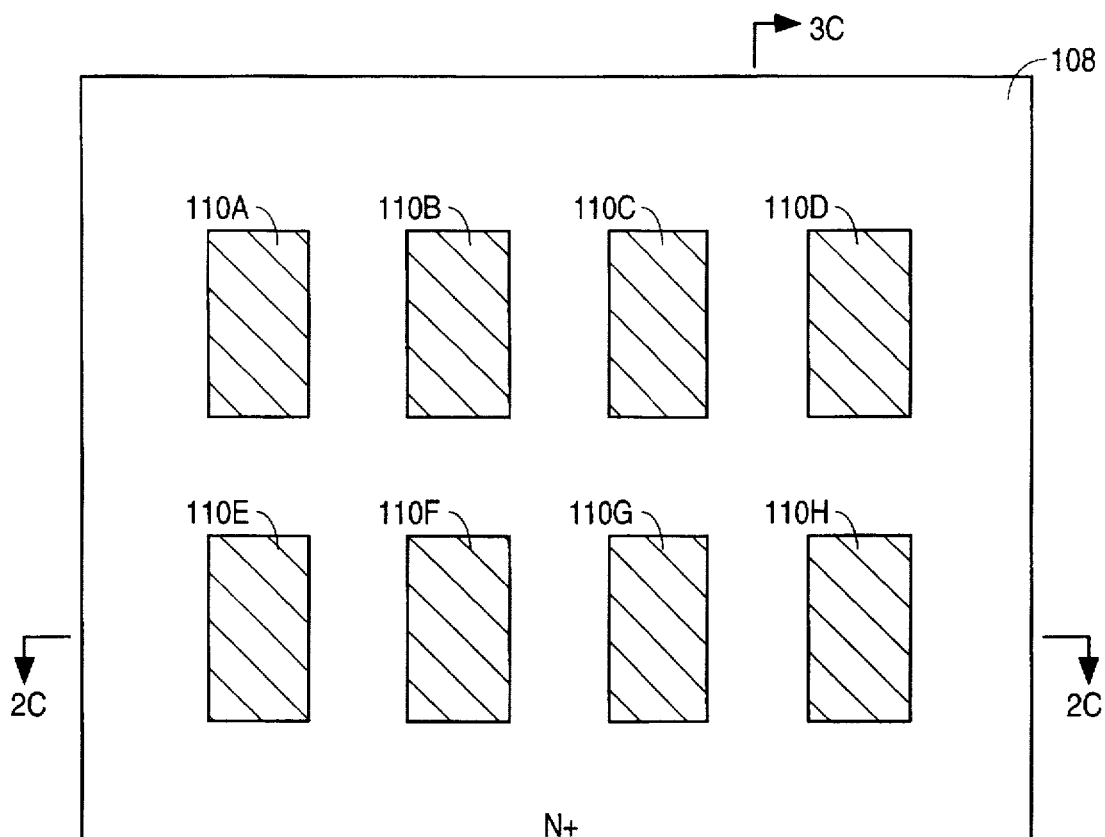
Figure 1D:
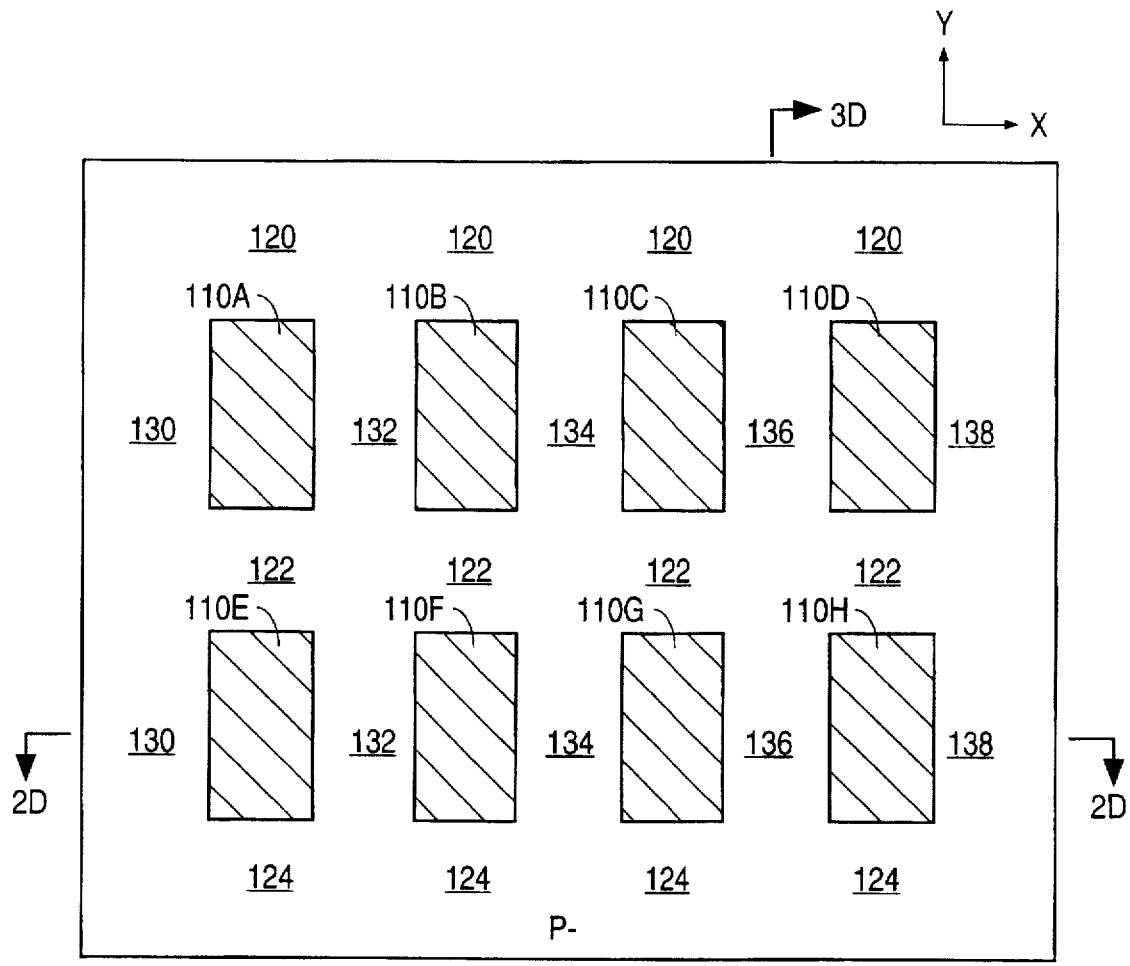
Figure 1E:
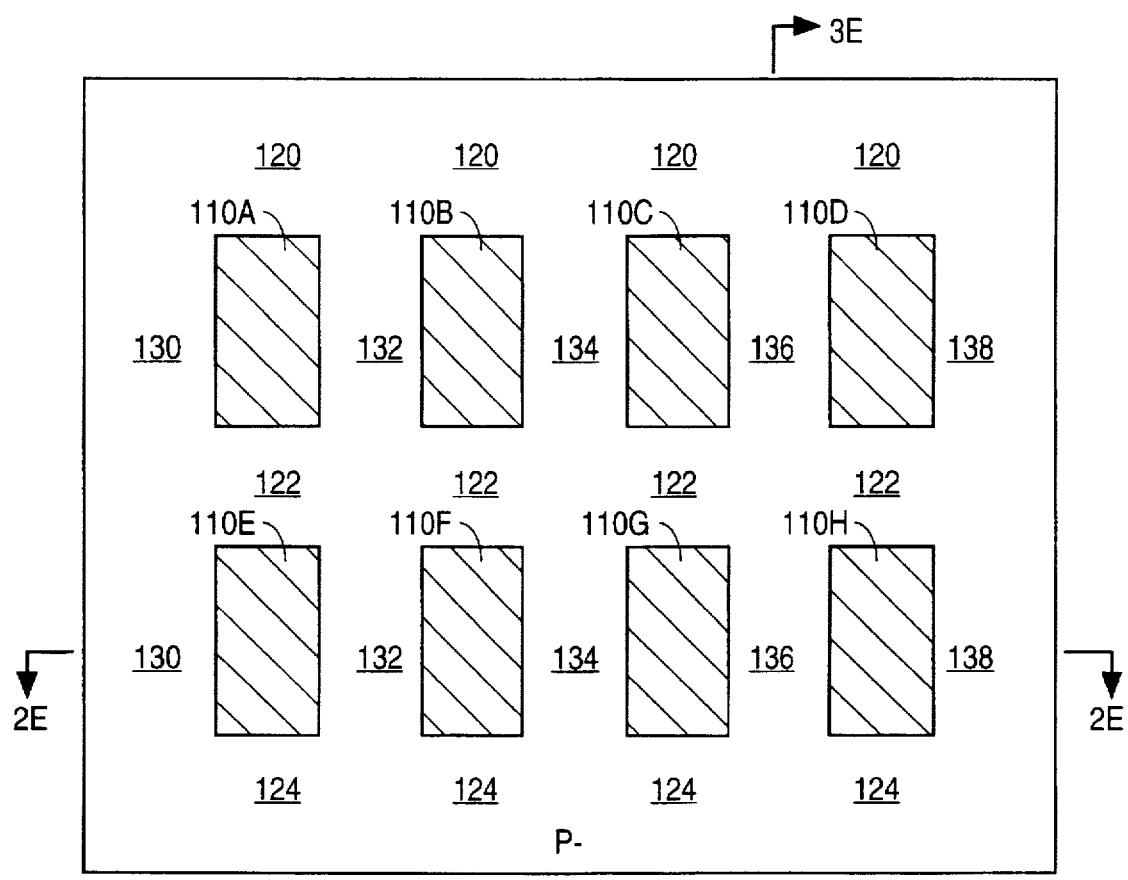
Figure 1F:
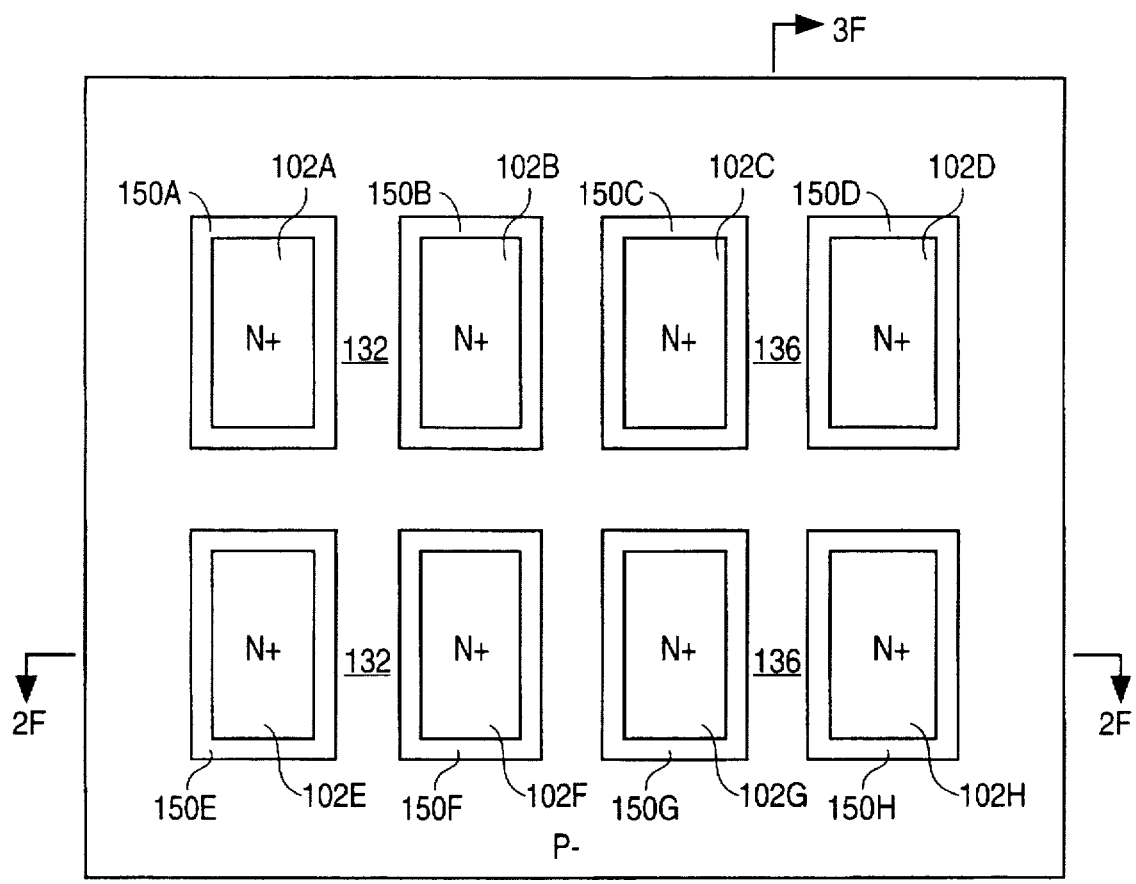
Figure 1G:
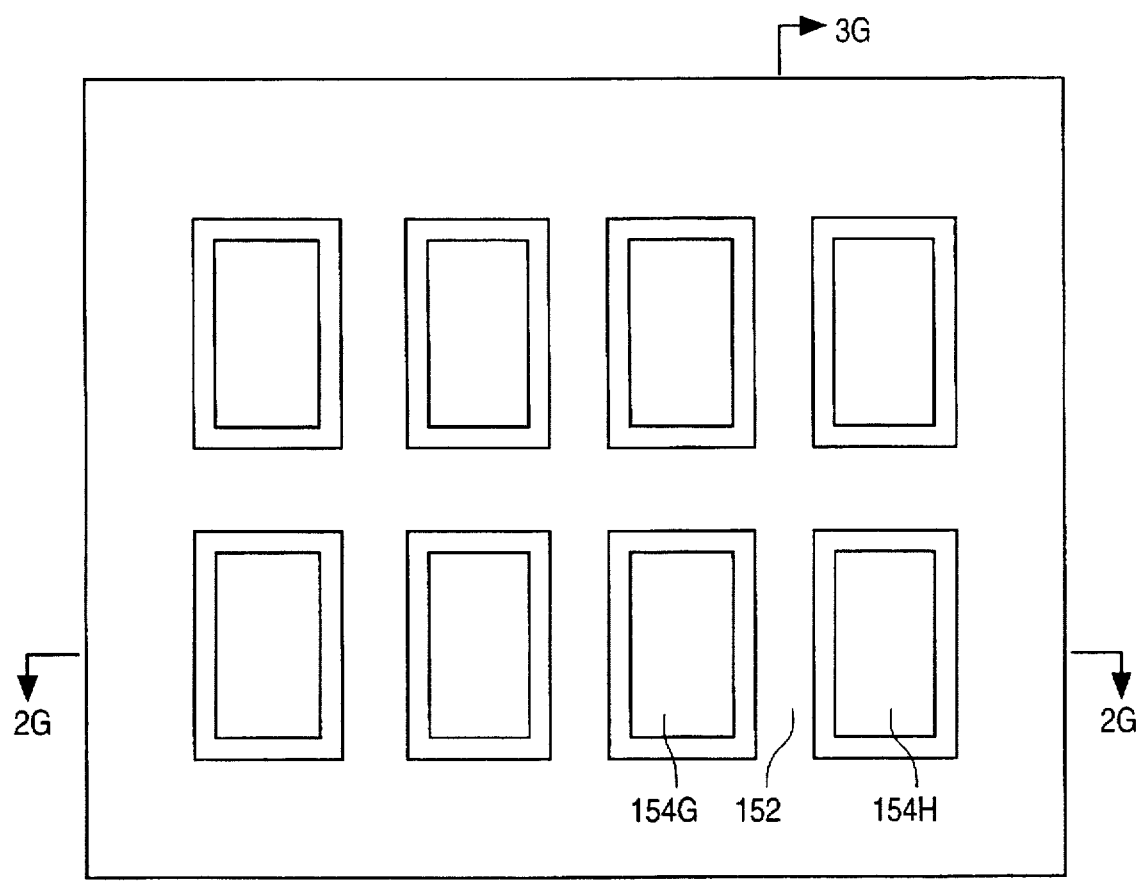
Figure 1H:
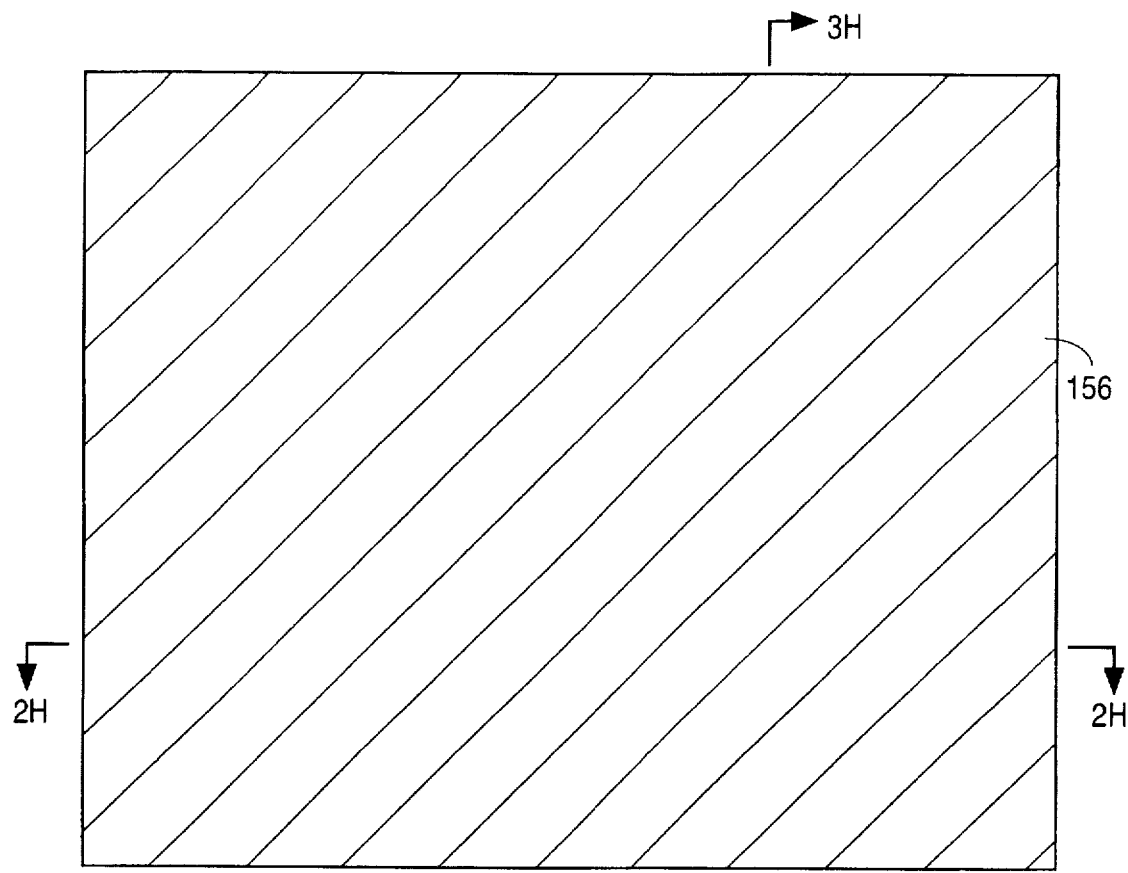
Figure 1I:
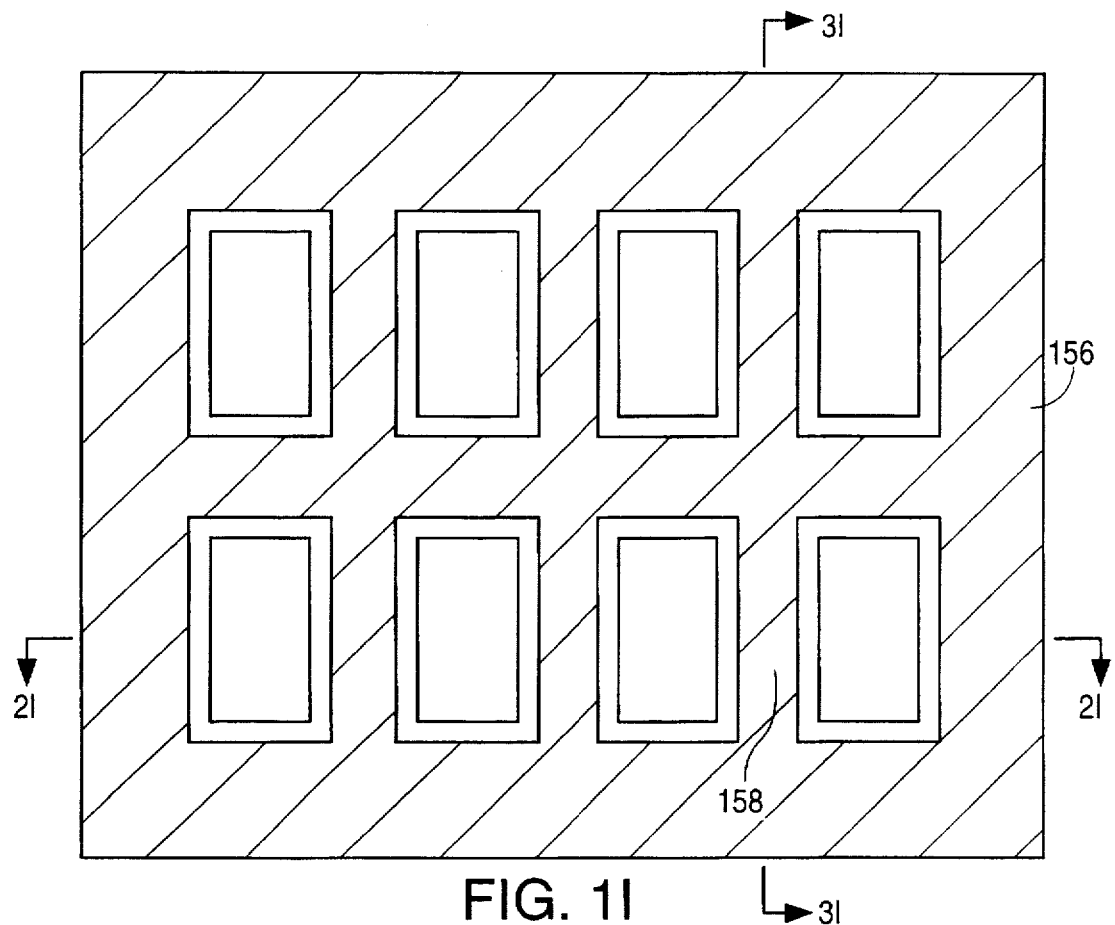
Figure 1J:
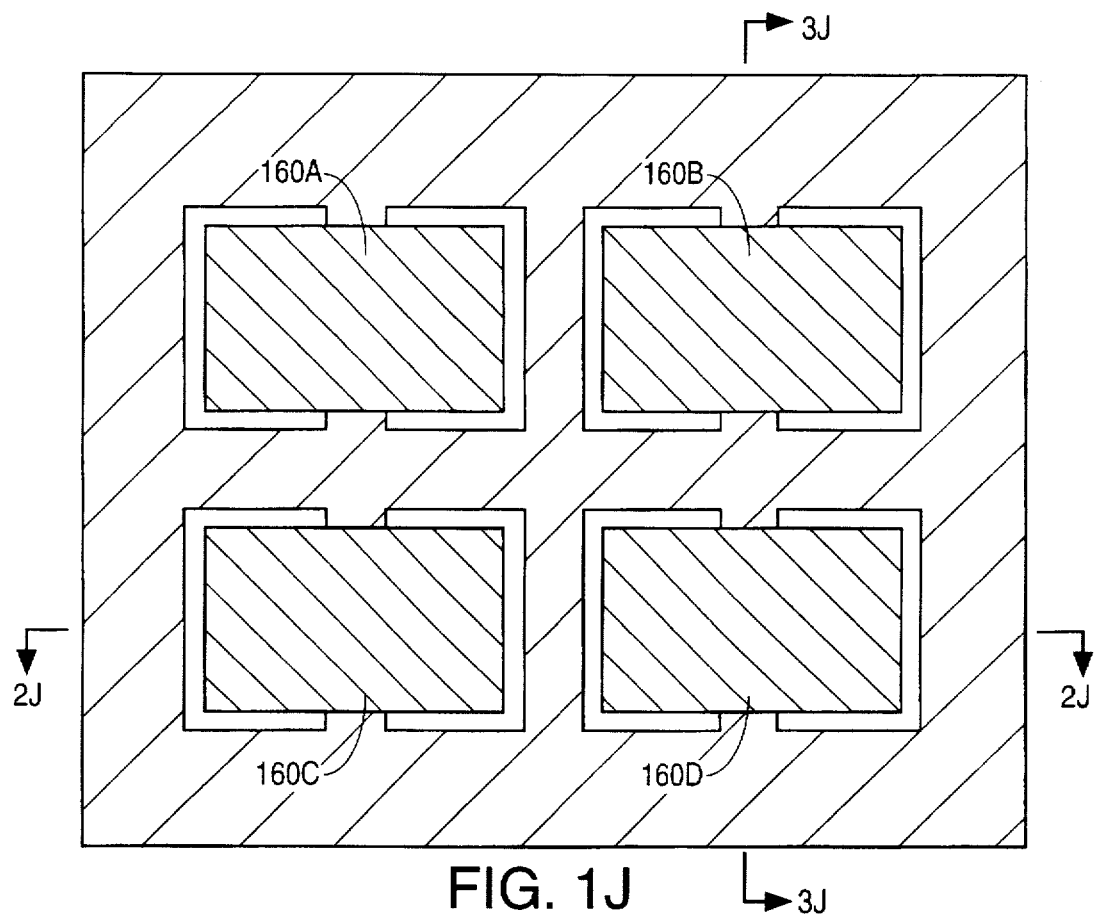
Figure 1K:
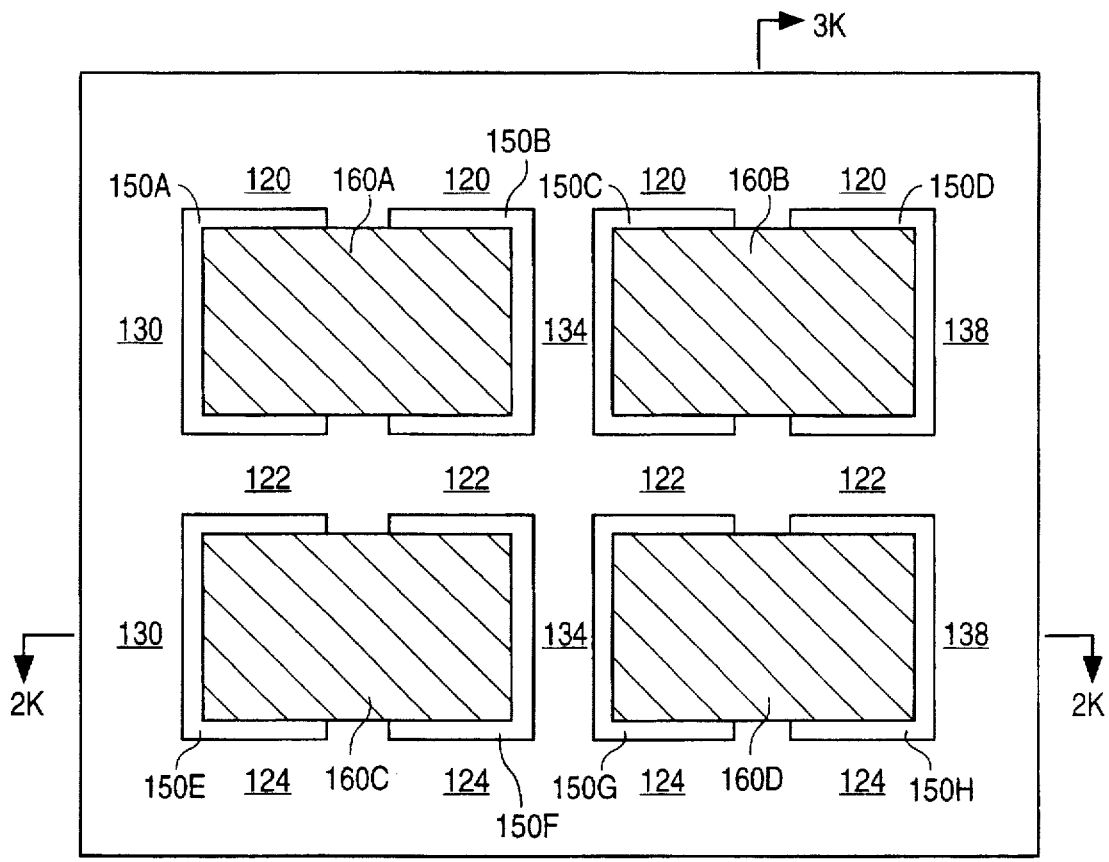
Figure 1L:
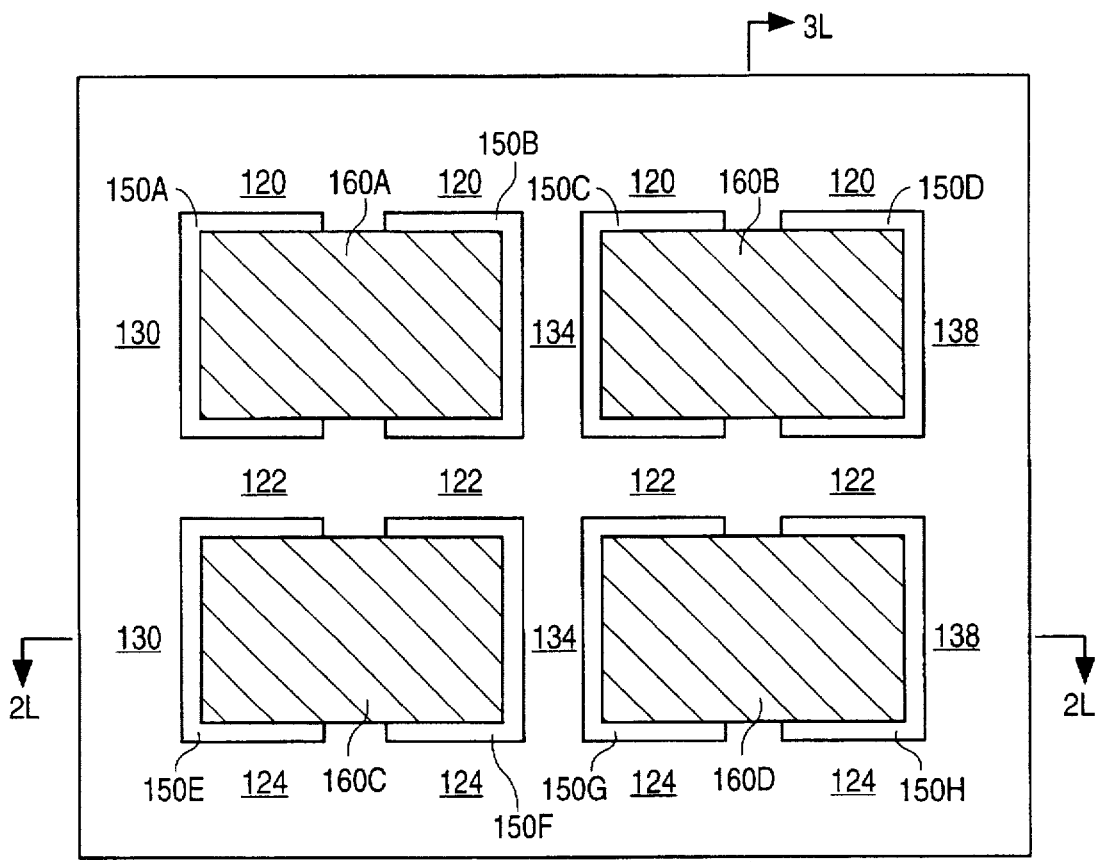
Figure 1M:
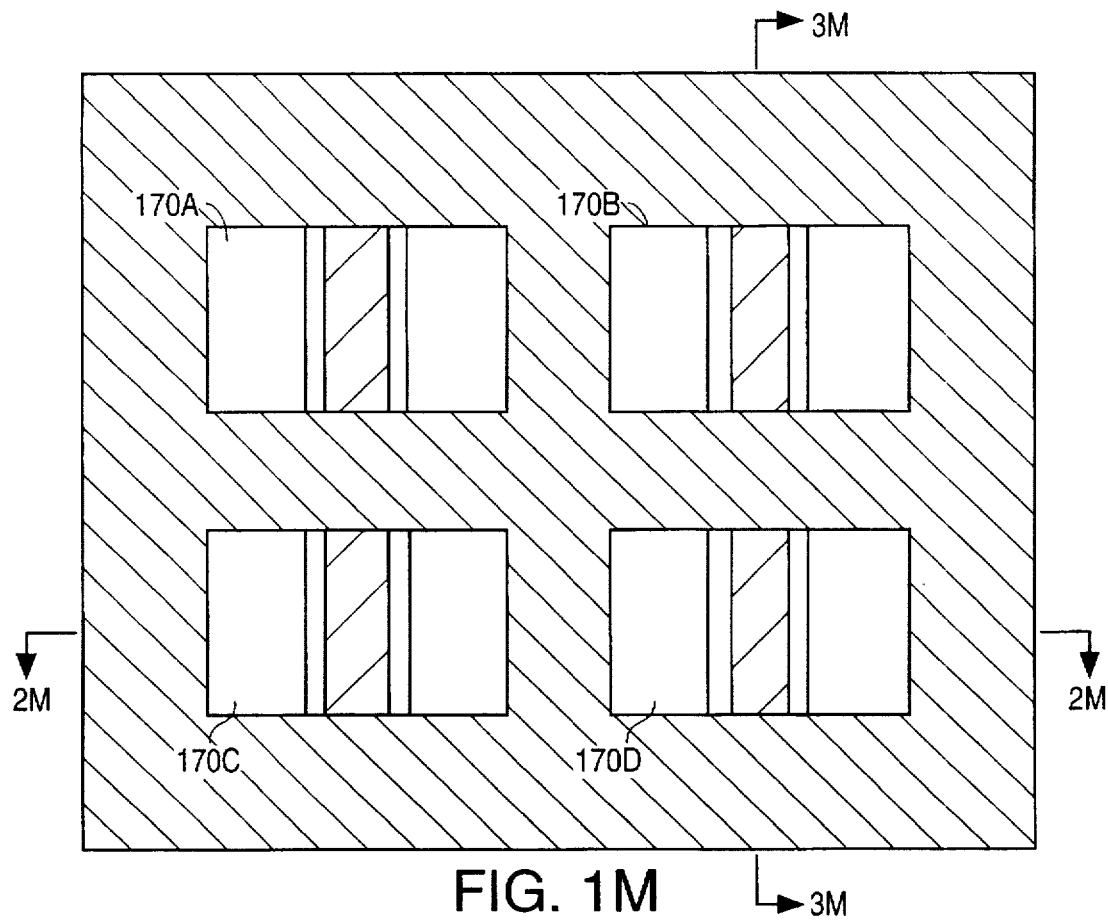
Figure 1N:
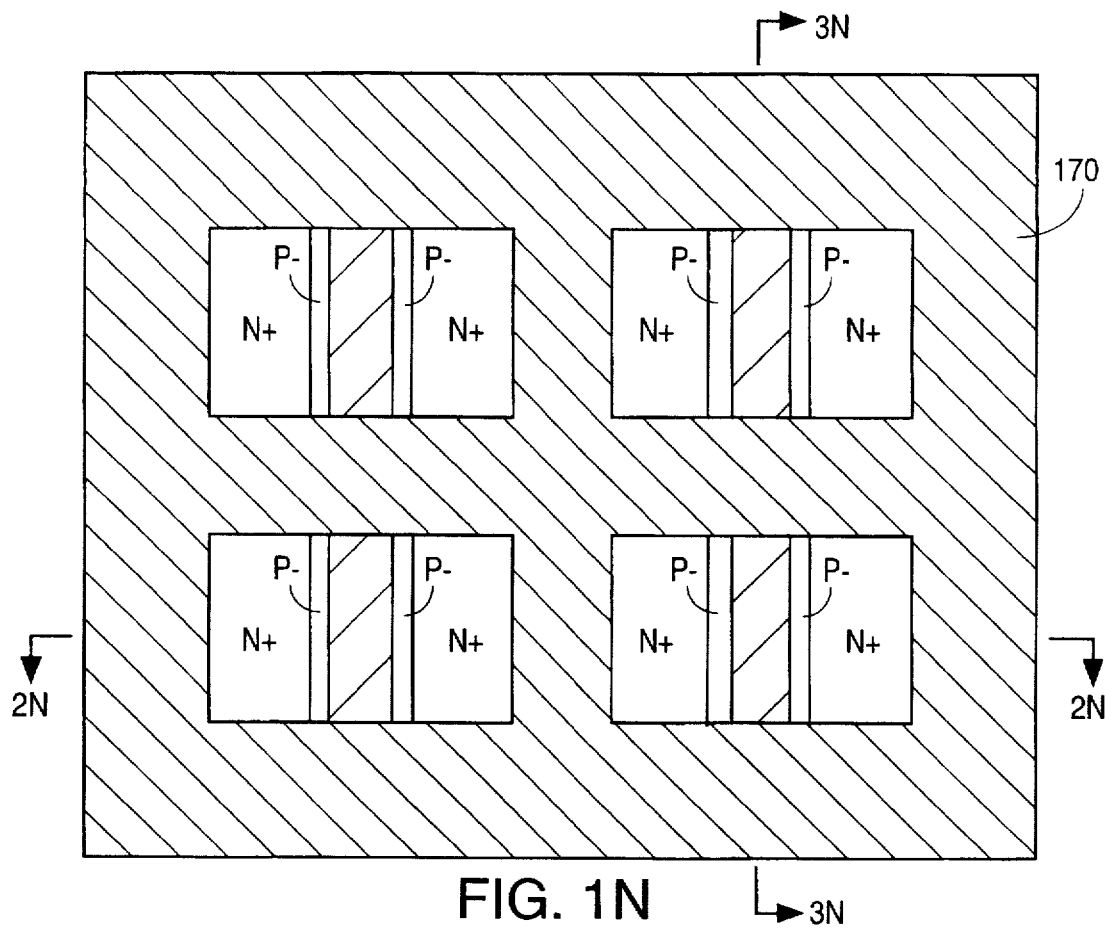
Figure 1O:
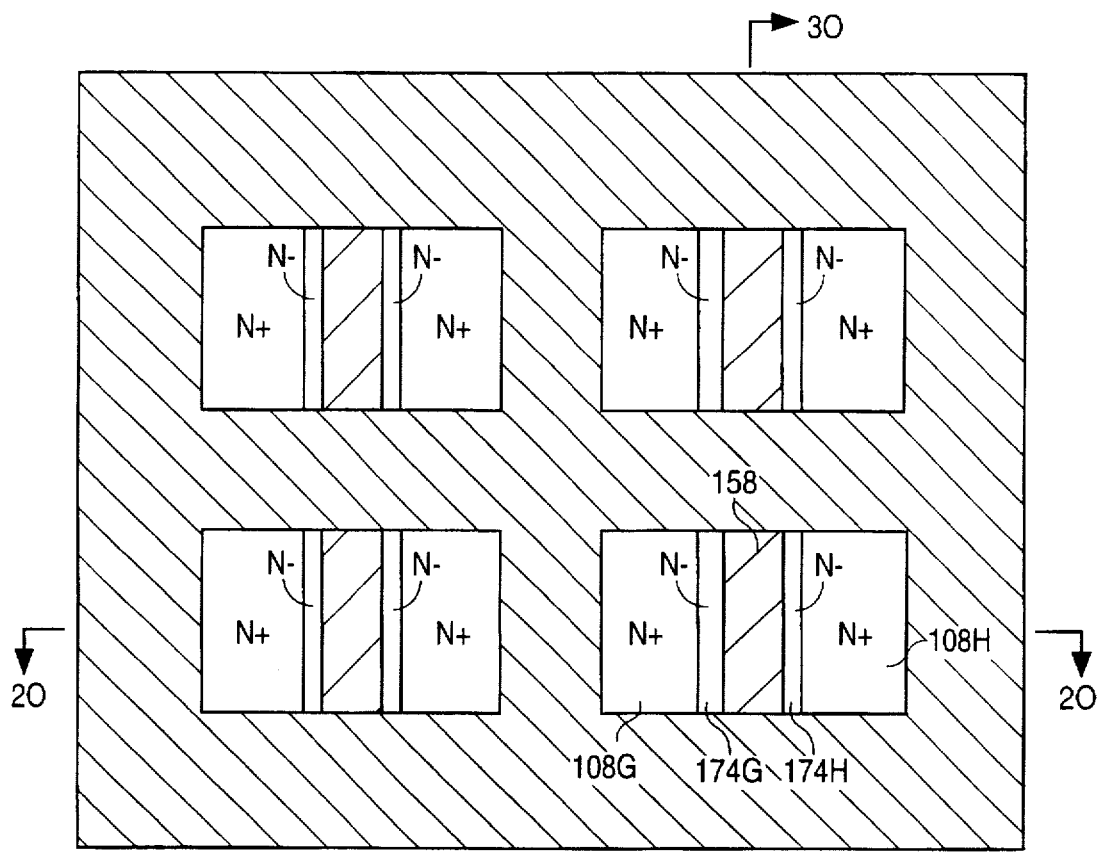
Figure 1P:
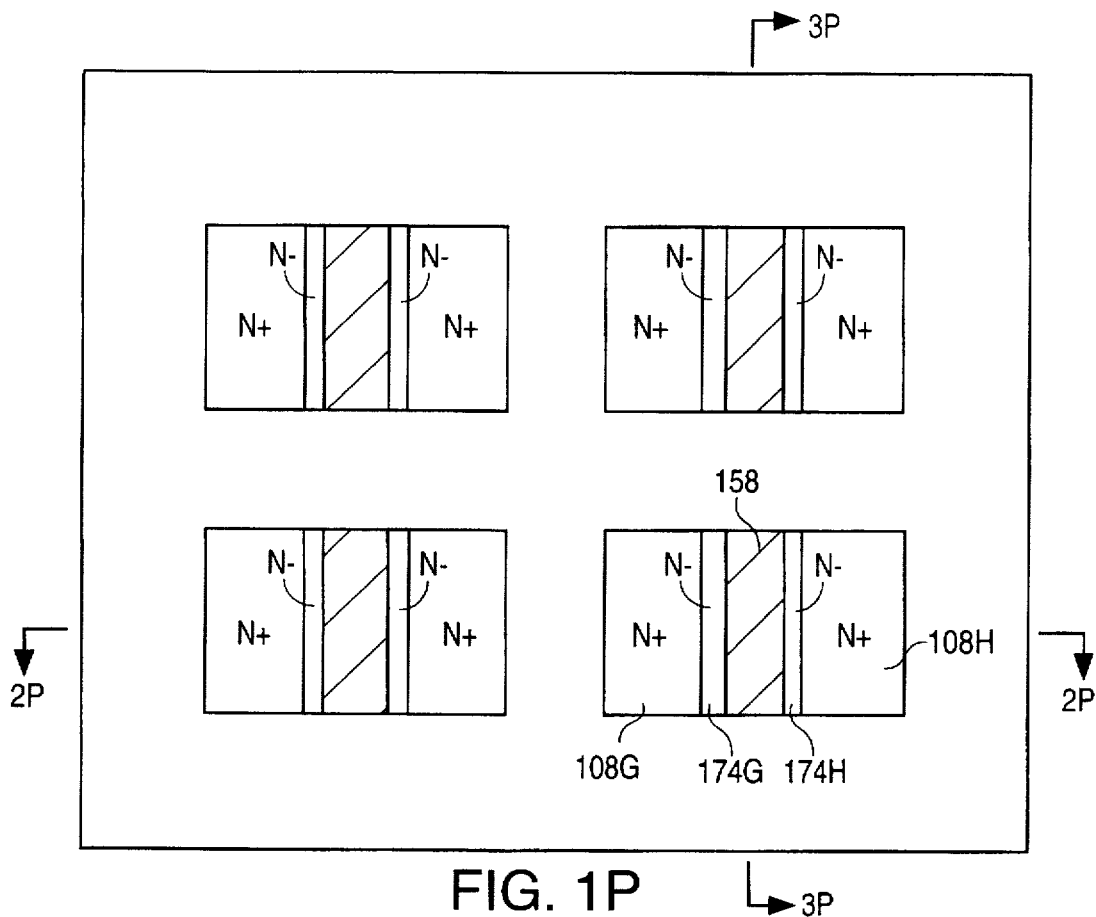
Figure 1Q:
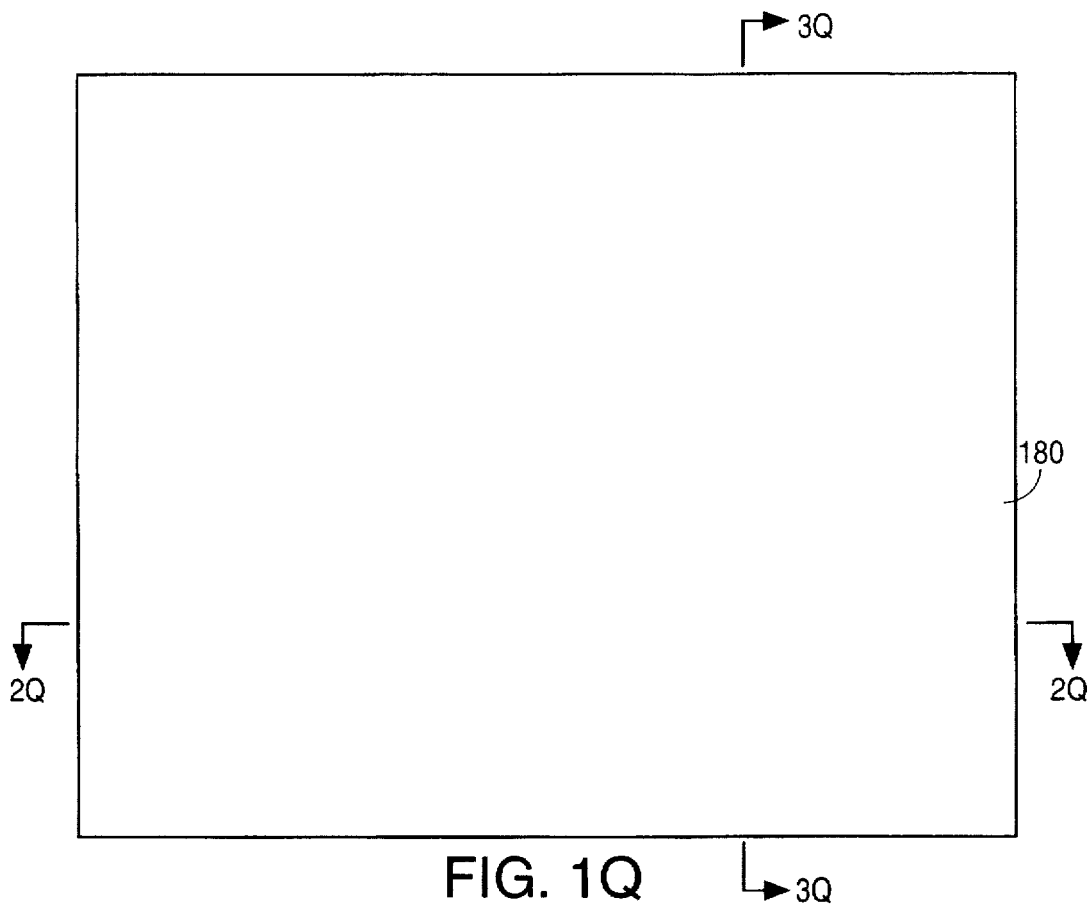

FIGS. 1A–1Q show top plan views of successive process steps for forming a plurality of IGFETs in combination with a trench array in accordance with an embodiment of the invention. FIGS. 2A–2Q show cross-sectional views taken along lines 2A—2A - 2Q—2Q of FIGS. 1A–1Q, respectively, and FIGS. 3A–3Q show cross-sectional views taken along lines 3A—3A-3Q—3Q of FIGS. 1A–1Q, respectively.

Figure 3A:
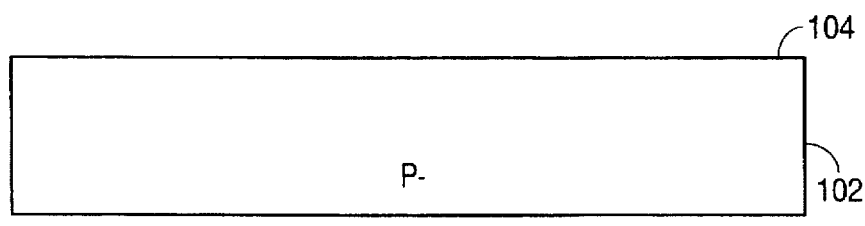
FIGS. 3A–3Q show cross-sectional views taken along lines 3A—3A-3Q—3Q of FIGS. 1A–1Q, respectively.

In FIGS. 1A, 2A and 3A, semiconductor substrate 102 suitable for integrated circuit manufacture is provided. Substrate 102 includes a P- epitaxial surface layer with a <100> orientation, a boron concentration of $1 \times 10^{15}$ atoms/cm$^3$ and a resistivity of 12 ohm-cm. Preferably, the epitaxial surface layer is disposed on a P+ base layer (not shown). The epitaxial surface layer has a planar top surface 104.

Figure 2B:
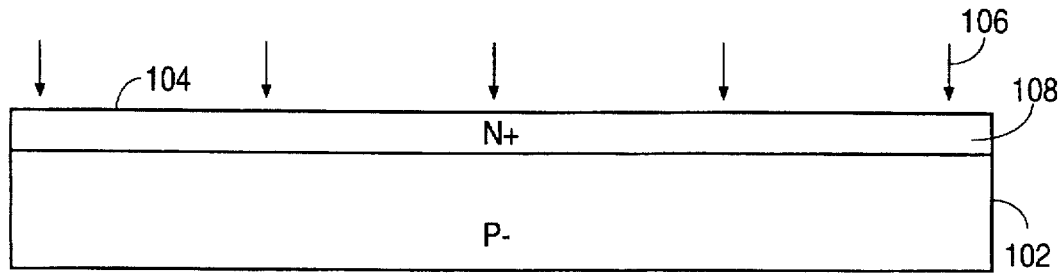
Figure 3B:
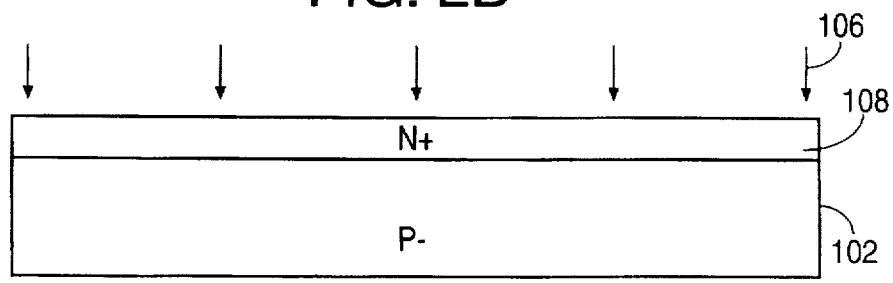

In FIG. 1B, 2B and 3B, substrate 102 is subjected to ion implantation of arsenic, indicated by arrows 106, at a heavy dosage in the range of $1 \times 10^{15}$ to $5 \times 10^{15}$ atoms/cm$^2$ and an energy in the range of 2 to 80 kiloelectron-volts. This forms N+ doped layer 108 with an arsenic concentration in the range of $1 \times 10^{20}$ to $1 \times 10^{21}$ atoms/cm$^3$ and a depth of 1800 angstroms beneath top surface 104.

Figure 2C:
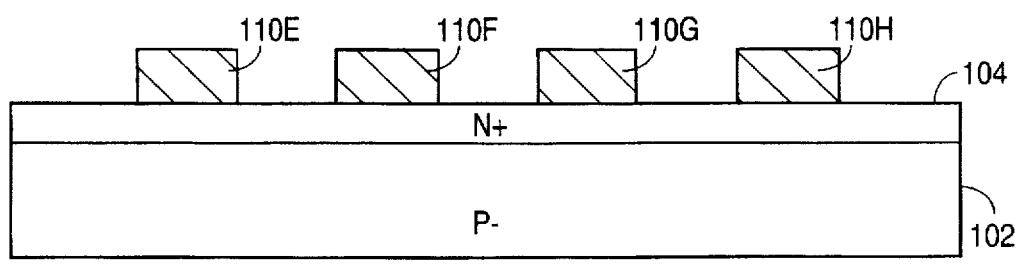
Figure 3C:
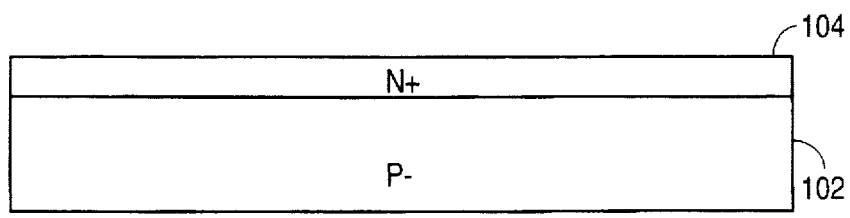

In FIGS. 1C, 2C and 3C, photoresist layer 110 is deposited as a continuous layer over top surface 104 and then selectively irradiated using a photolithographic system, such as a step and repeat optical projection system, in which I-line ultraviolet light from a mercury-vapor lamp is projected through a reticle and a focusing lens to project the desired image pattern on photoresist layer 110. Thereafter, photoresist layer 110 is developed and the irradiated portions are removed to so that photoresist layer 110 includes photoresist segments 110A–110H. The openings between photoresist segments 110A–110H correspond to the desired location of a trench array to be etched into substrate 102. The minimum resolution (i.e. linewidth and spacing) of the step and repeat system is 4000 angstroms (0.4 microns). Therefore, to reduce feature sizes, adjacent one's of photoresist segments 110A–110H are spaced by 4000 angstroms.

Figure 2D:
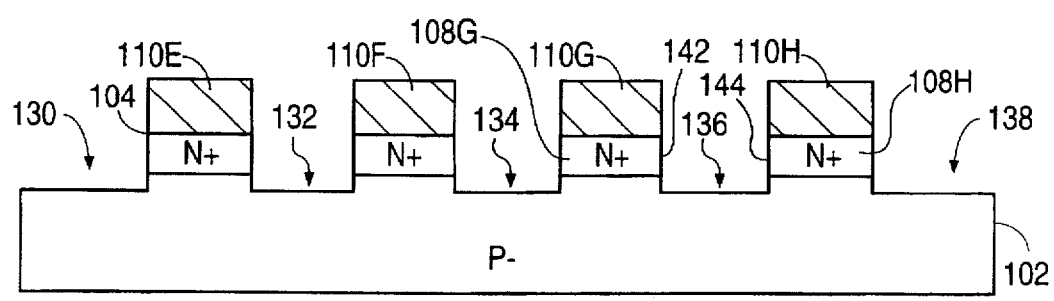
Figure 3D:
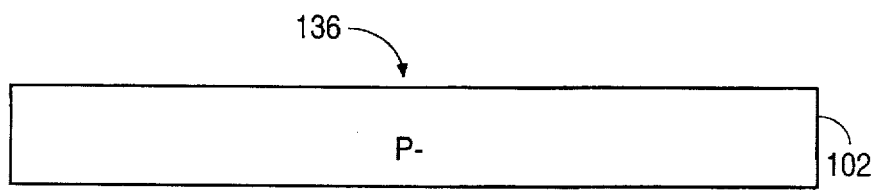

In FIGS. 1D, 2D and 3D, an anisotropic etch that is highly selective of silicon is provided by a reactive ion etch using photoresist layer 10 as an etch mask. The etch forms a trench array in substrate 102. The trench array includes x-direction trenches 120, 122, and 124 spaced from and in parallel with one another. The trench array also includes y-direction trenches 130, 132, 134, 136 and 138 spaced from and in parallel with one another. As is seen, the y-direction trenches are orthogonal to and intersect with the x-direction trenches. The trenches surround rectangular regions of the substrate, denoted substrate regions 102A–102H, beneath photoresist segments 110A–110H, respectively, that extend to top surface 104. (Substrate regions 102A–102D are not visible in FIGS. 1D, 2D and 3D, but are visible in FIGS. 1F and 1N–1P). For instance, trenches 122, 124, 134 and 136 surround substrate region 102G beneath photoresist segment 110G, and trenches 122, 124, 136 and 138 surround substrate region 102H beneath photoresist segment 110H. In addition, the trenches each extend 2000 angstroms beneath top surface 104. Thus, the trenches extend completely through doped layer 108, but only partially through substrate 102.

Four essentially identical IGFETs will be fabricated in separate quadrants of substrate 102.

A first IGFET will be fabricated between trenches 120, 122, 130 and 134; a second IGFET will be fabricated between trenches 120, 122, 134 and 138; a third IGFET will be fabricated between trenches 122, 124, 130 and 134; and a fourth IGFET will be fabricated between trenches 122, 124, 134 and 138. The first IGFET will include a source in substrate region 102A, a drain in substrate region 102B, and a gate insulator and gate electrode in trench 132 between trenches 120 and 122. The second IGFET will include a source in substrate region 102C, a drain in substrate region 102D, and a gate insulator and gate electrode in trench 136 between trenches 120 and 122. The third IGFET will include a source in substrate region 102E, a drain in substrate region 102F, and a gate insulator and gate electrode in trench 132 between trenches 122 and 124. The fourth IGFET will include a source in substrate region 102G, a drain in substrate region 102H, and a gate insulator and gate electrode in trench 136 between trenches 122 and 124. In addition, trenches 120, 122, 124, 130, 134 and 138 will be filled with an insulator, thereby providing device isolation for the four IGFETs.

Since the four IGFETs to be fabricated are essentially identical, for purposes of brevity, it is convenient to focus on the fourth IGFET in the bottom right quadrant. It is understood that the other three IGFETs shall be formed in a similar manner.

The channels to be formed for the IGFETs will have effective lengths, between respective sources and drains, that extend in the x-direction. Therefore, when discussing features such as the trenches or substrate regions, the "length" shall extend in the x-direction (i.e., parallel to line 2D—2D) and the "width" shall extend in the y-direction (i.e., parallel to line 3D—3D). However, when viewed from above (i.e., FIG. 1D), the "linewidth" of trenches 120–124 extend in the y-direction, and the "linewidth" of trenches 130–138 extend in the x-direction.

Substrate regions 102G and 102H each have a length (in the x-direction) of 4000 angstroms, and a width (in the y-direction) of 8000 angstroms. Trench 136 includes opposing vertical sidewalls 142 and 144, and planar bottom surface 146. Sidewall 142 is adjacent to substrate region 102G, sidewall 144 is adjacent to substrate region 102H, and bottom surface 146 extends between substrate regions 102G and 102H. Trench 136 has a depth (or height) of 2000 angstroms between top surface 104 and bottom surface 146, and a length (or linewidth) of 4000 angstroms between sidewalls 142 and 144. Doped layer 108 includes sidewall source region 108G in substrate region 102G, and sidewall drain region 108H in substrate region 102H. Trench 136 extends 200 angstroms beneath sidewall source and drain regions 108G and 108H.

Figure 2E:
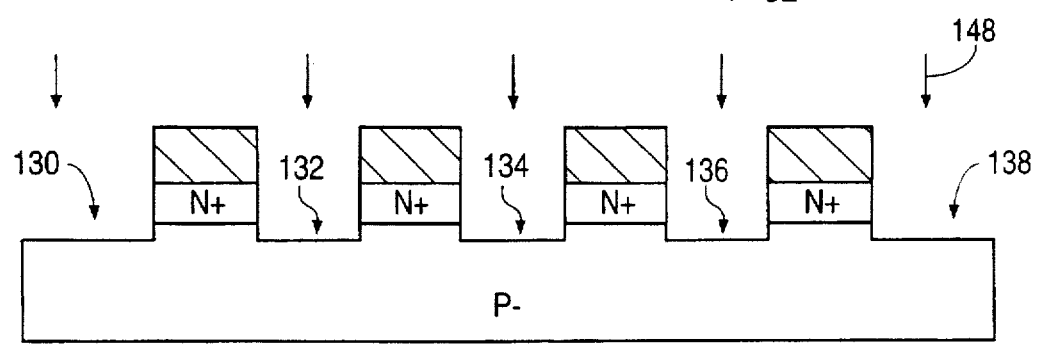
Figure 3E:
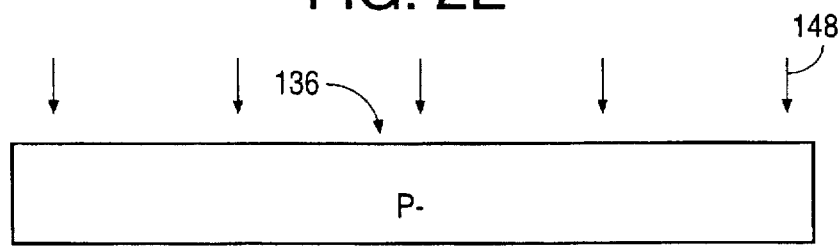

In FIGS. 1E, 2E and 3E, a channel implant provided by boron, as indicated by arrows 148, is implanted through the bottom surfaces of the trenches using photoresist layer 110 as an implant mask. The channel implant is most useful beneath the bottom surfaces of trenches 132 and 136 between trenches 120 and 122, and between trenches 122 and 124, where the channels for the IGFETs shall be formed. Although the channel implant extends beneath the bottom surfaces trenches 120, 122, 124, 130, 134 and 138, this will not adversely affect the IGFETs (and in fact supplements a subsequent channel-stop implant). The channel implant includes a well implant, then a punchthrough implant, and then a threshold voltage implant. The well implant provides a more uniform background doping, the punchthrough implant provides the channels with greater robustness to punchthrough voltages, and the threshold voltage implant sets the threshold voltage of the IGFETs to approximately 0.4 to 0.7 volts. The well implant is provided by boron at a dose in the range of $1 \times 10^{12}$ to $1 \times 10^{13}$ atoms/cm$^2$ and an energy in the range of 100 to 170 kiloelectron-volts, the punchthrough implant is provided by boron at a dose in the range of $1 \times 10^{12}$ to $1 \times 10^{13}$ atoms/cm$^2$ and an energy in the range of 40 to 100 kiloelectron-volts, and the threshold voltage implant is provided by boron at a dose in the range of $1 \times 10^{12}$ to $1 \times 10^{13}$ atoms/cm$^2$ and an energy in the range of 2 to 30 kiloelectron-volts. The channel implant has a boron concentration on the order of $1 \times 10^{17}$ atoms/cm$^3$ and provides suitable doping for a channel adjacent, for instance, to bottom surface 146.

Figure 2F:
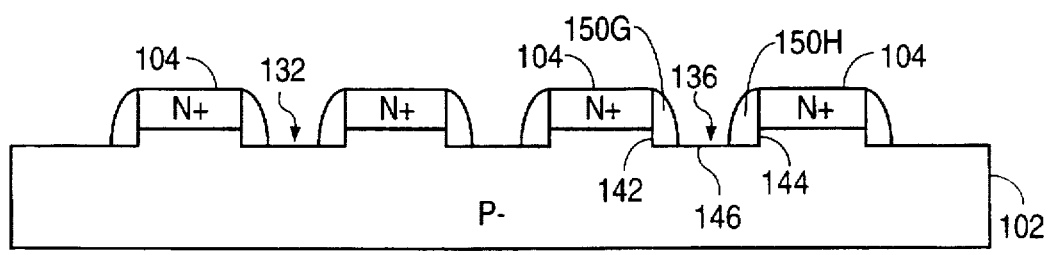
Figure 3F:
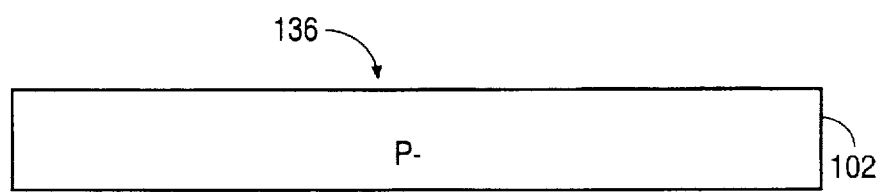

In FIGS. 1F, 2F and 3F, photoresist layer 110 is stripped, and a blanket layer of silicon dioxide that is 2500 angstroms thick is conformally deposited over substrate 102 and fills the trenches. Thereafter, an anisotropic etch is provided by a reactive ion etch that is highly selective of silicon dioxide with respect to silicon. The etch forms oxide spacers 150A–150H in the trenches and adjacent to the sidewalls of substrate regions 102A–102H, respectively. The etch also removes the oxide above top surface 104, thereby exposing substrate regions 102A–102H, and removes the oxide above central portions of the bottom surfaces of the trenches, which also become exposed. For instance, oxide spacers 150G and 150H extend to top surface 104, contact and completely cover sidewalls 142 and 144, respectively, contact and cover outer portions of bottom surface 146 adjacent to sidewalls 142 and 144, respectively, but leave exposed a central portion of bottom surface 146 between and adjacent to the outer portions. Oxide spacers 150G and 150H each have a length of 1200 angstroms along the outer portions of bottom surface 146. Therefore, the central portion of bottom surface 146 has a length of 1600 angstroms (4000–2400 angstroms), and is spaced from sidewalls 142 and 144 by 1200 angstroms.

The spacer dimensions depend on several factors, including the heights and lengths of the trenches, the thickness of the conformal spacer oxide layer, and the duration of the spacer etch. The spacer dimensions are selected to provide the desired scaling of trench lengths of trenches 132 and 136 to channel lengths of channels to be formed beneath trenches 132 and 136. However, the channel lengths depends on other factors including the characteristics of the source and drain regions and a high-temperature anneal. Preferably, the channel lengths are scaled to less than half trench lengths of trenches 132 and 136, and less than 2000 angstroms.

Figure 2G:
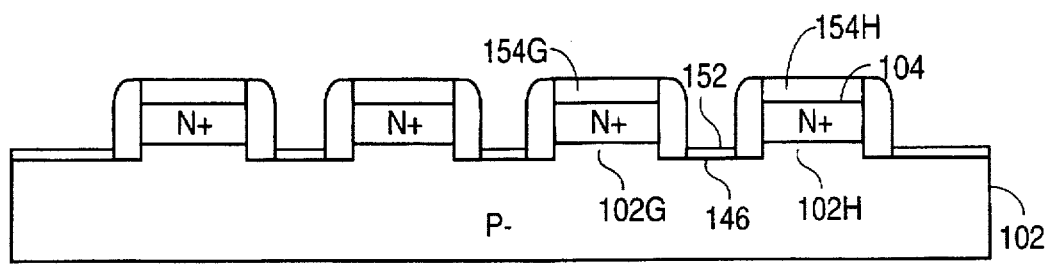
Figure 3G:
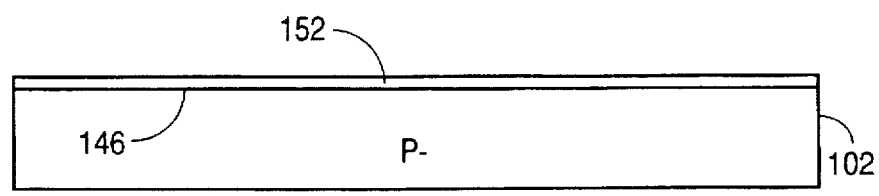

In FIGS. 1G, 2G and 3G, a high quality layer of silicon dioxide is thermally grown on the exposed silicon surfaces using tube growth at a temperature of 700 ° to 1000° C. in an $O_2$ containing ambient. As a result, oxide regions are formed on the central portions of the bottom surfaces of the trenches, and oxide segments are formed on top surface 104. The oxide segments on top surface 104 are considerably thicker than the oxide regions on the bottom surfaces of the trenches due to the heavy doping of arsenic at top surface 104. The size the of oxide spacers increases as well. The oxide regions include gate oxide 152 with a thickness of 50 angstroms on the central portion of bottom surface 146, and the oxide segments include oxide segments 154G and 154H on substrate regions 102G and 102H, respectively. The combination of the oxide spacers, oxide regions and oxide segments provide a continuous oxide layer over substrate 102.

Figure 2H:
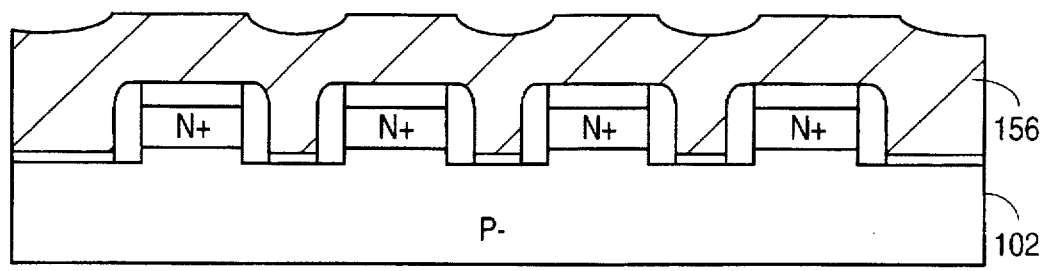
Figure 3H:
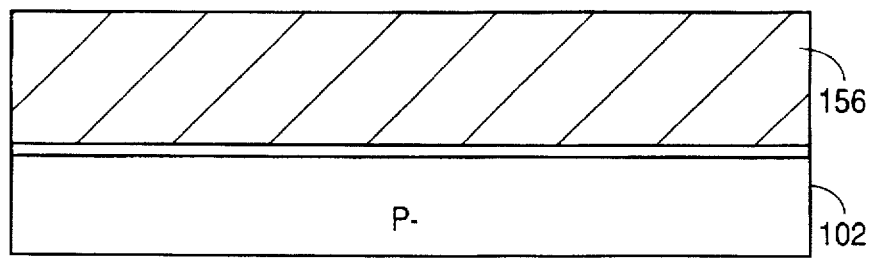

In FIGS. 1H, 2H and 3H, a blanket layer of undoped polysilicon 156 with a thickness of 4000 angstroms is deposited by low pressure chemical vapor deposition over substrate 102. Thus, polysilicon 156 is deposited on the oxide spacers, the oxide regions, and the oxide segments, and fills the remaining space in the trenches. Polysilicon 156 can be doped in situ as deposition occurs. Alternatively, polysilicon 156 can be doped by subjecting the structure to ion implantation of arsenic at a heavy dose in the range of $1 \times 10^{15}$ to $5 \times 10^{15}$ atoms/cm$^2$ and an energy in the range of 2 to 80 kiloelectron-volts since polysilicon 156 is thick enough to prevent the arsenic ions from passing through to the underlying structure.

Figure 2I:
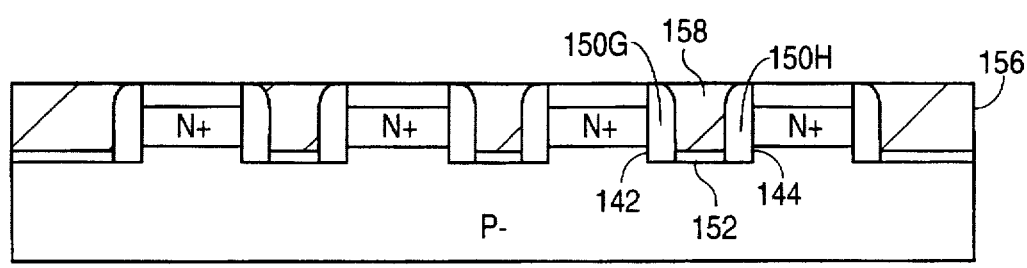
Figure 3I:
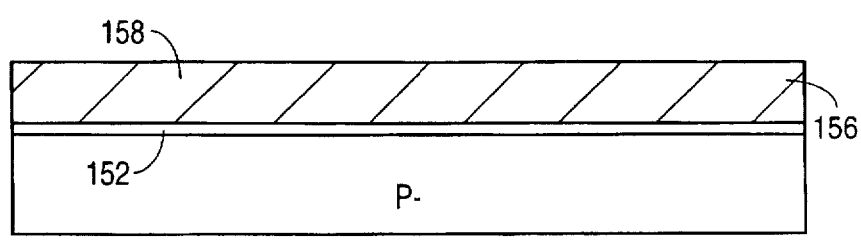

In FIGS. 1I, 2I and 3I, the structure is planarized by applying chemical-mechanical polishing in the presence of an abrasive slurry that is highly selective of polysilicon with respect to silicon dioxide. The polishing grinds down polysilicon 156 until no portion of polysilicon 156 overlaps top surface 104. The polishing is discontinued before reaching top surface 104 using the oxide spacers and oxide segments as a stop-layer. The top surfaces of the oxide spacers, oxide segments, and the remaining polysilicon 156 are aligned and form a planar surface slightly above top surface 104. The remaining polysilicon 156 also provides gate electrodes for the IGFETs. For instance, the remaining polysilicon 156 includes polysilicon gate electrode 158 in trench 136, on oxide spacers 150A and 150B and gate oxide 152, and between trenches 122 and 124. Polysilicon gate electrode 158 is substantially aligned with top surface 104, all of polysilicon gate electrode 158 is within the length of trench 136 (between sidewalls 142 and 144), and substantially all of polysilicon gate electrode 158 is within trench 136 (with a slight amount extending above trench 136).

Figure 2J:
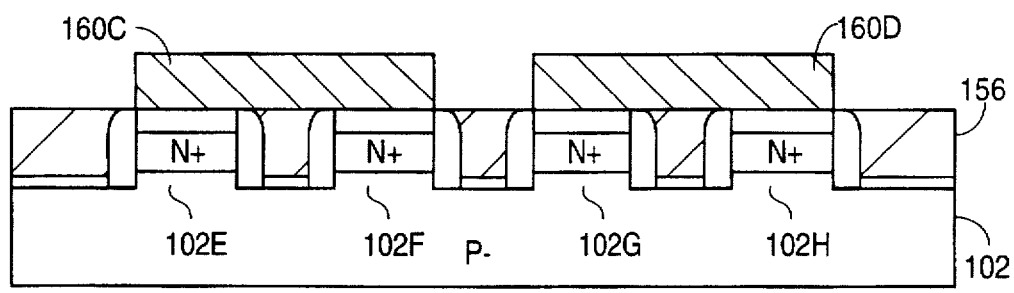
Figure 3J:
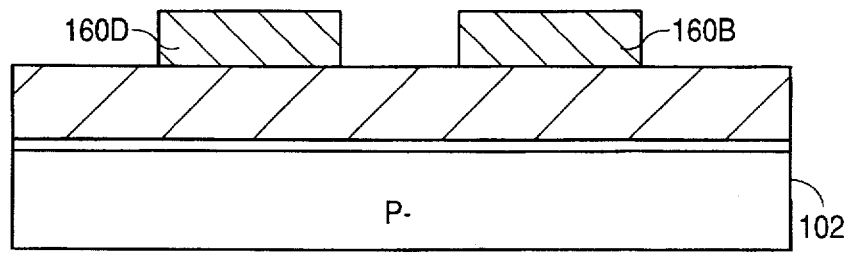

In FIGS. 1J, 2J and 3J, photoresist layer 160 is deposited as a continuous layer over substrate 102 and then selectively irradiated using the step and repeat system. Thereafter, photoresist layer 160 is developed and the irradiated portions are removed. As a result, photoresist layer 160 includes photoresist segments 160A-160D. Photoresist segment 160A covers substrate regions 102A and 102B and the portion of trench 132 therebetween, photoresist segment 160B covers substrate regions 102C and 102D and the portion of trench 136 therebetween, photoresist segment 160C covers substrate regions 102E and 102F and the portion of trench 132 therebetween, and photoresist segment 160D covers substrate regions 102G and 102H and the portion of trench 136 therebetween. The opening in photoresist layer 160 is above trenches 120, 122, 124, 130, 134 and 138.

Figure 2K:
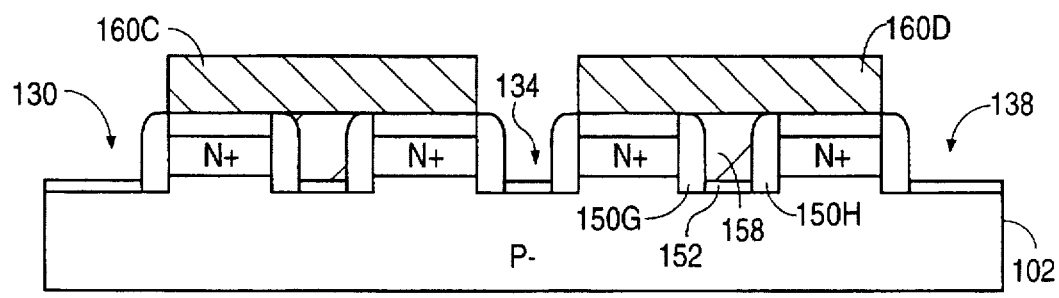
Figure 3K:
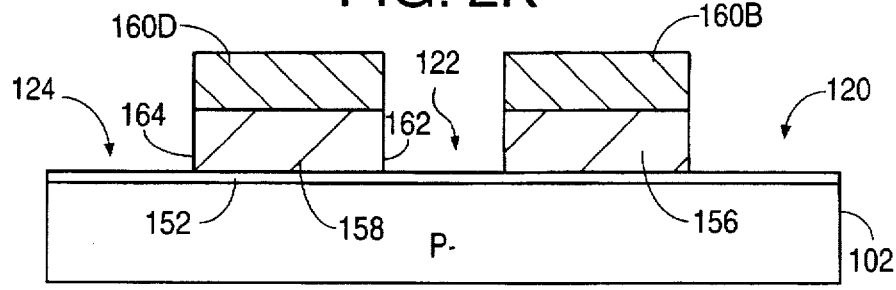

In FIGS. 1K, 2K and 3K, an anisotropic etch that is highly selective of polysilicon with respect to silicon dioxide is provided by a reactive ion etch using photoresist layer 160 as an etch mask. The etch completely removes the remaining polysilicon 156 outside photoresist segments 160A-160D. As a result, the central portions of the bottom surfaces of trenches 120, 122, 124, 130, 134 and 138 become re-exposed, as do the portions of oxide spacers 150A-150H in trenches 120, 122, 124, 130, 134 and 138. The remaining polysilicon 156 beneath photoresist segments 160A-160D, however, is protected from the etch. Of importance, polysilicon gate electrode 158 now includes sidewalls 162 and 164 adjacent to trenches 122 and 124, respectively, and therefore is decoupled from the other polysilicon gate electrodes. Polysilicon gate electrode 158 is spaced from and electrically isolated from substrate 102 by oxide spacers 150G and 150H and gate oxide 152. No portion of polysilicon gate electrode 158 contacts substrate 102.

Figure 2L:
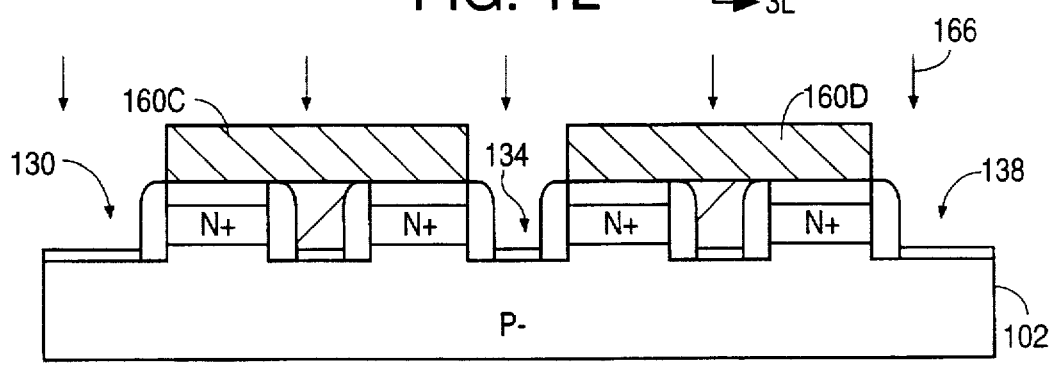
Figure 3L:
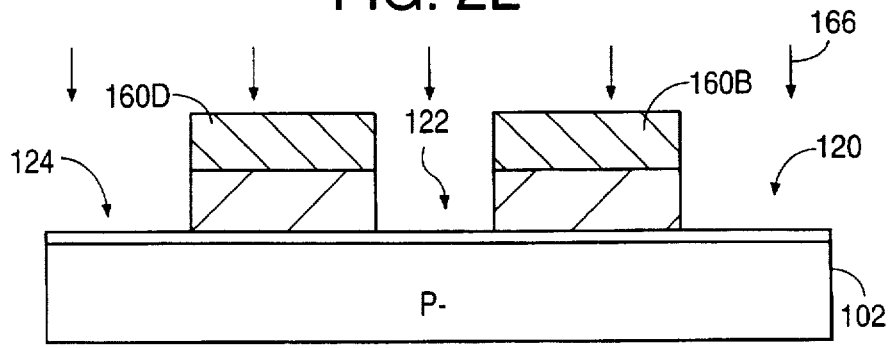

In FIGS. 1L, 2L and 3L, a channel-stop implant provided by boron, as indicated by arrows 166, is implanted through the oxide regions on the central portions of the bottom surfaces of trenches 120, 122, 124, 130, 134 and 138 into the underlying regions of substrate 102 using photoresist layer 160 and oxide spacers 150A-150H as an implant mask. The channel-stop implant is provided by boron at a dose in the range of $5 \times 10^{12}$ to $1 \times 10^{13}$ atoms/cm$^2$ and an energy in the range of 100 to 200 kiloelectron-volts, and has a boron concentration on the order of $5 \times 10^{17}$ atoms/cm$^3$. The channel-stop implant provides suitable doping to reduce or eliminate spurious channels that might otherwise arise beneath trenches 120, 122, 124, 130, 134 and 138 between adjacent IGFETs during operation.

Figure 2M:
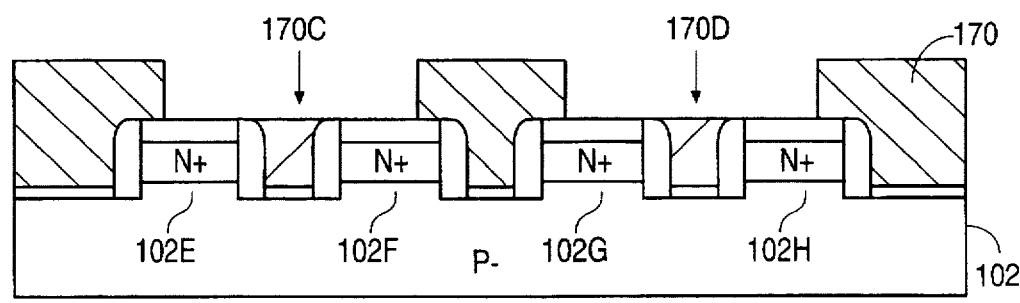
Figure 3M:
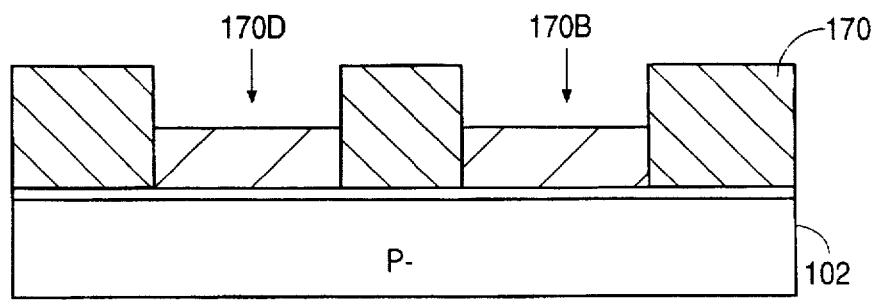

In FIGS. 1M, 2M and 3M, photoresist layer 160 is stripped, and photoresist layer 170 is deposited as a continuous layer over substrate 102 and then selectively irradiated using the step and repeat system. Thereafter, photoresist layer 170 is developed and the irradiated portions are removed to so that photoresist layer 170 includes openings 170A-170D. Thus, photoresist layer 170 is similar to a mirror image of photoresist layer 160. That is, opening 170A is above substrate regions 102A and 102B and the portion of trench 132 therebetween, opening 170B is above substrate regions 102C and 102D and the portion of trench 136 therebetween, opening 170C is above substrate regions 102E and 102F and the portion of trench 132 therebetween, and opening 170D is above substrate regions 102G and 102H and the portion of trench 136 therebetween.

However, that photoresist layer 170 covers small portions of substrate regions 102A and 102E adjacent to trench 130, small portions of substrate regions 102B, 102C, 102F and 102G adjacent to trench 134, and small portions of substrate regions 102D and 102H adjacent to trench 138.

Figure 2N:
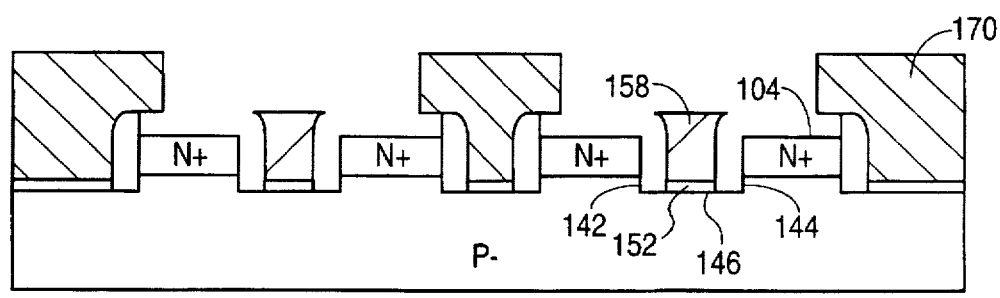
Figure 3N:
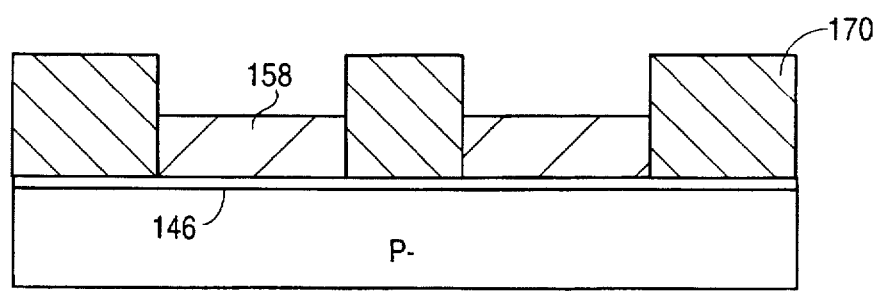

In FIGS. 1N, 2N and 3N, a wet etch is applied that is highly selective of silicon dioxide with respect to polysilicon and silicon. The wet etch removes the portions of oxide spacers 150A-150H and the oxide segments that are exposed by openings 170A-170D. The wet etch also undercuts portions of the oxide segments on top surface 104 beneath photoresist layer 170. For instance, the wet etch removes portions of oxide spacers 150G and 150H that are sandwiched between polysilicon gate electrode 158 and sidewalls 142 and 144, thereby exposing the outer portions of bottom surface 146, and removes oxide segments 154G and 154H entirely. The wet etch also undercuts a slight amount of gate oxide 152 beneath the bottom surface of polysilicon gate electrode 158. Preferably, the wet etch provides a precisely controlled oxide removal rate to minimize the removal of gate oxide 152.

Figure 2O:
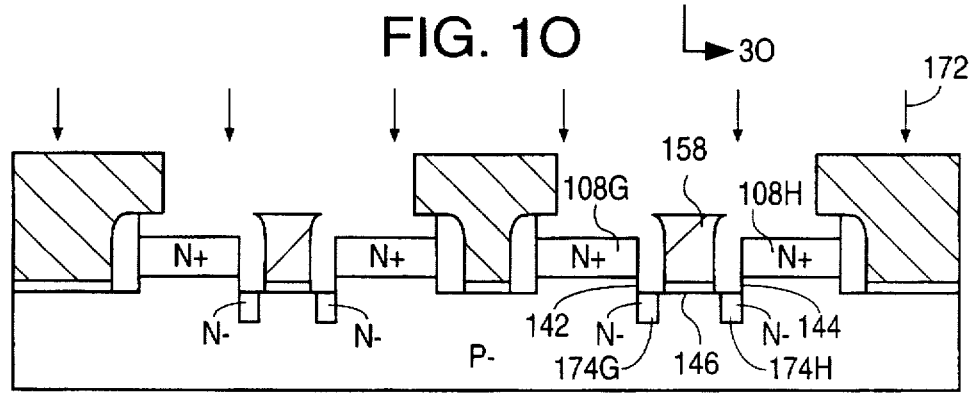
Figure 3O:
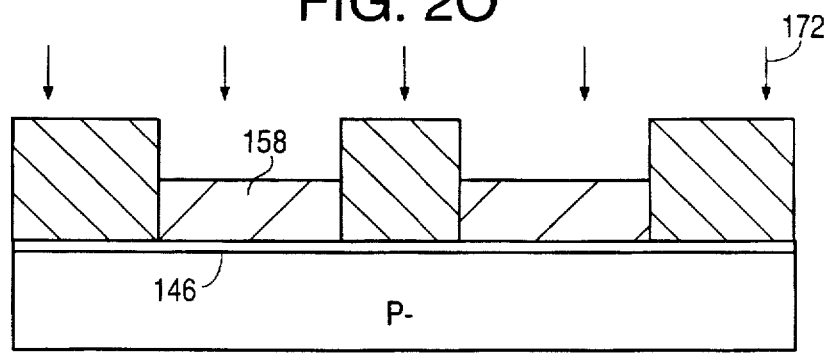

In FIGS. 1O, 2O and 3O, substrate 102 is subjected to ion implantation of arsenic, indicated by arrows 172, at a light dosage in the range of $1 \times 10^{13}$ to $5 \times 10^{14}$ atoms/cm$^2$ and an energy in the range of 2 to 80 kiloelectron-volts. The implant has little effect on sidewall source and drain regions 108G and 108H, which are already doped N+. Polysilicon gate electrode 158 provides an implant mask for the central portion of bottom surface 146. However, arsenic ions travel through the voids in trench 136 between polysilicon gate electrode 158 and sidewalls 142 and 144 and through the exposed outer portions of bottom surface 146 to implant localized source region 174G and localized drain region 174H in substrate 102. Localized source and drain regions 174G and 174H are adjacent to the outer portions of bottom surface 146, extend to sidewalls 142 and 144, respectively, and are slightly outside gate oxide 152 (and thus the bottom surface of polysilicon gate electrode 158). Localized source and drain regions 174G and 174H are doped N− with an arsenic concentration in the range of $5 \times 10^{17}$ to $5 \times 10^{18}$ atoms/cm$^3$ and a depth of 1000 angstroms beneath bottom surface 146.

Figure 2P:
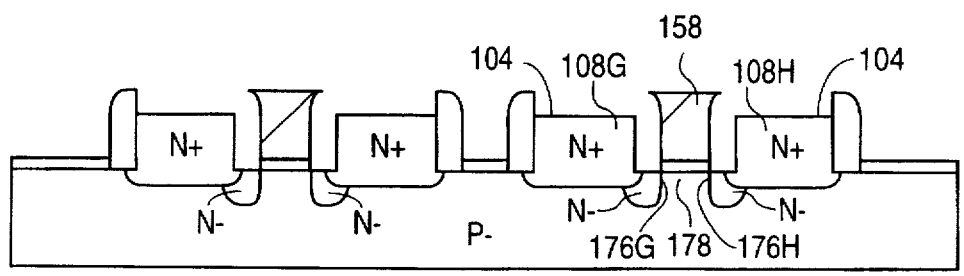
Figure 3P:
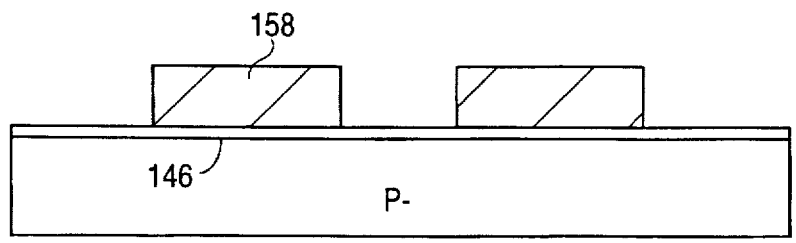
Figure 2Q:
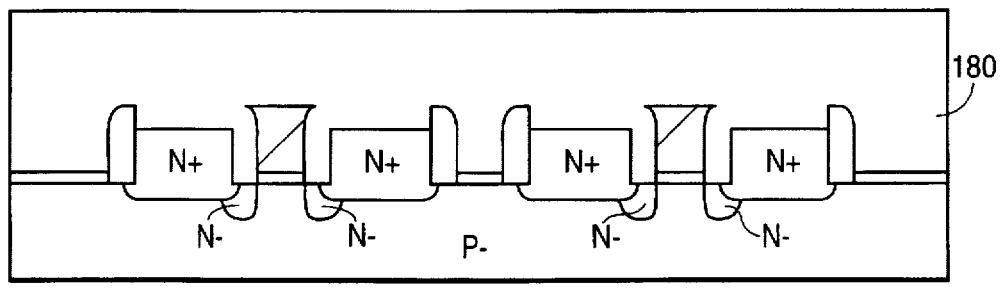
Figure 3Q:
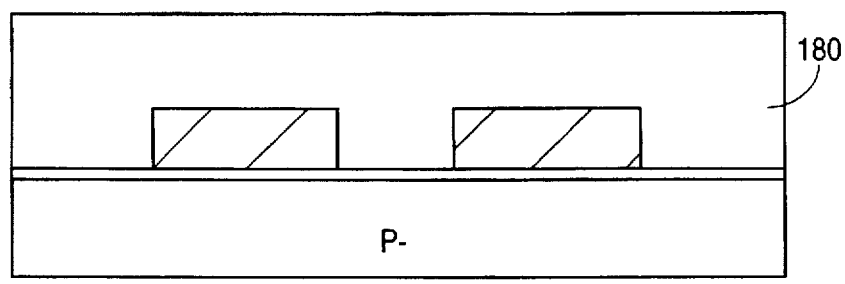

In FIGS. 1P, 2P and 3P, photoresist layer 170 is stripped, and a rapid thermal anneal on the order of 950 to 1050° C. for 10 to 30 seconds is applied to remove crystalline damage and to activate and drive-in the implanted dopants. Sidewall source and drain regions 108G and 108H diffuse slightly beneath bottom surface 146. As a result, source regions 108G and 174G merge to form a source, and drain regions 108H and 174H merge to form a drain. Localized drain region 174H provides a lightly doped drain (LDD). Advantageously, the LDD reduces hot carrier effects during operation as is well known in the art. Furthermore, localized source and drain regions 174G and 174H provide channel junctions 176G and 176H, respectively, which define channel 178. As is seen, channel junctions 176G and 176H and channel 178 are beneath and adjacent to bottom surface 146, and substantially aligned with the bottom surface of polysilicon gate electrode 158. Channel 178 has a length of approximately 1600 angstroms. Sidewall source and drain regions 108G and 108H extend to top surface 104 for receiving source/drain contacts. Accordingly, polysilicon gate electrode 158 controls an N-channel MOSFET with channel 178 between the source and drain.

In FIGS. 1Q, 2Q and 3Q, a blanket layer of silicon dioxide shown as oxide layer 180 with a thickness of 12,000 to 15,000 angstroms is deposited by low pressure chemical vapor deposition over substrate 102. Oxide layer 180 fills the remaining space in the trenches. Thus, trenches 120, 122, 124, 130, 134 and 138 are filled with oxide, and in combination with the channel-stop implant provide device isolation for the IGFETs. Thereafter, the structure is planarized by applying chemical-mechanical polishing in the presence of an abrasive slurry that is highly selective of silicon dioxide. The polishing grinds down oxide layer 180, and is discontinued after removing about 4000 angstroms so that oxide layer 180 has a planar top surface.

Further processing steps in the fabrication of IGFETs typically include forming contact windows in the oxide layer above the sources, drains and gate electrodes, forming appropriate interconnect metallization in the contact windows, and then forming a passivation layer. In addition, either earlier or subsequent high-temperature process steps can be used to supplement or replace the high-temperature anneal to provide the desired anneal, activation, and diffusion for the implanted dopants. These further processing steps are conventional and need not be repeated herein. Likewise the principal processing steps disclosed herein may be combined with other steps readily apparent to those skilled in the art.

At completion of the process, for each of the IGFETs, it is preferred that the channel length be precisely controlled. However, to the extent that the lateral locations of the channel junctions are not (or can not be) precisely controlled, it is far preferable to have a slight overlap between the channel junctions and the bottom surface of the gate electrode as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source/drain involves a tradeoff between switching speed and drive current.

In the embodiment described above, trenches 120, 122, 124, 130, 134 and 138 provide device isolation for the IGFETs, and selected IGFETs are subsequently interconnected using an overlying metallization pattern. FIGS. 4–7 show top plan views of a plurality of IGFETs in combination with a trench array in accordance with additional embodiments of the invention in which selected gate electrodes and/or source/drain regions are interconnected without the need for an overlying metallization pattern.

Figure 4:
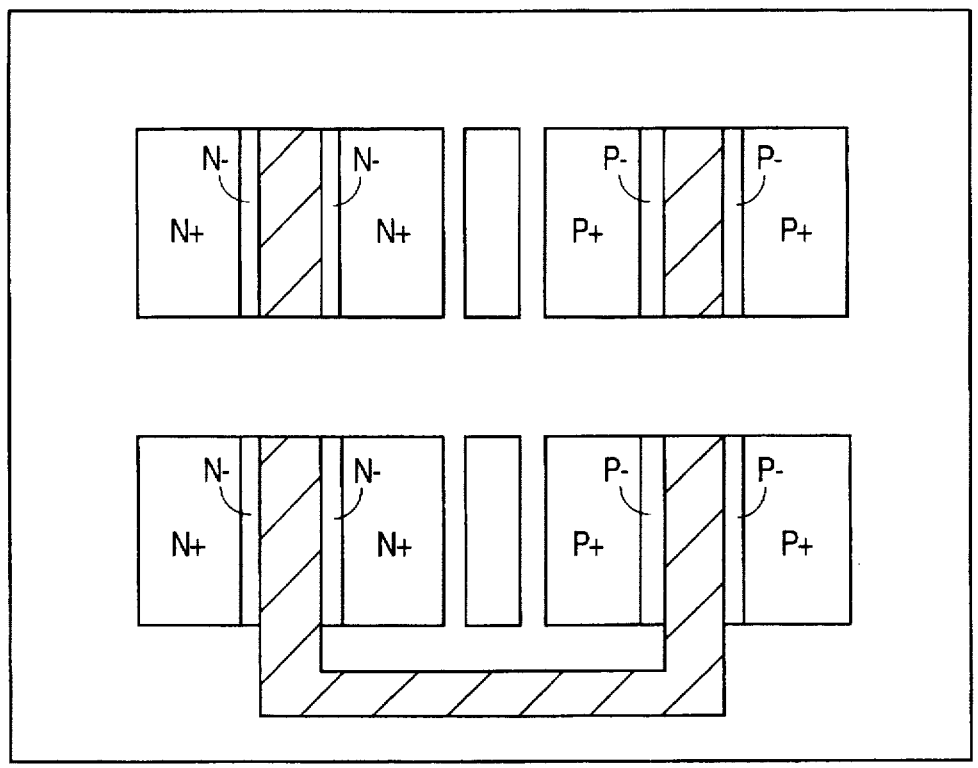
FIGS. 4–7 show top plan views of a plurality of IGFETs in combination with a trench array in accordance with additional embodiments of the invention in which selected gate electrodes and/or source/drain regions are interconnected without the need for an overlying metallization pattern.

In FIG. 4, the IGFETs in the lower quadrants are N-channel and P-channel devices that provide an inverter circuit. The gate electrodes of these devices are provided by a U-shaped continuous strip of polysilicon which extends into an x-direction trench adjacent to the IGFETs.

Figure 5:
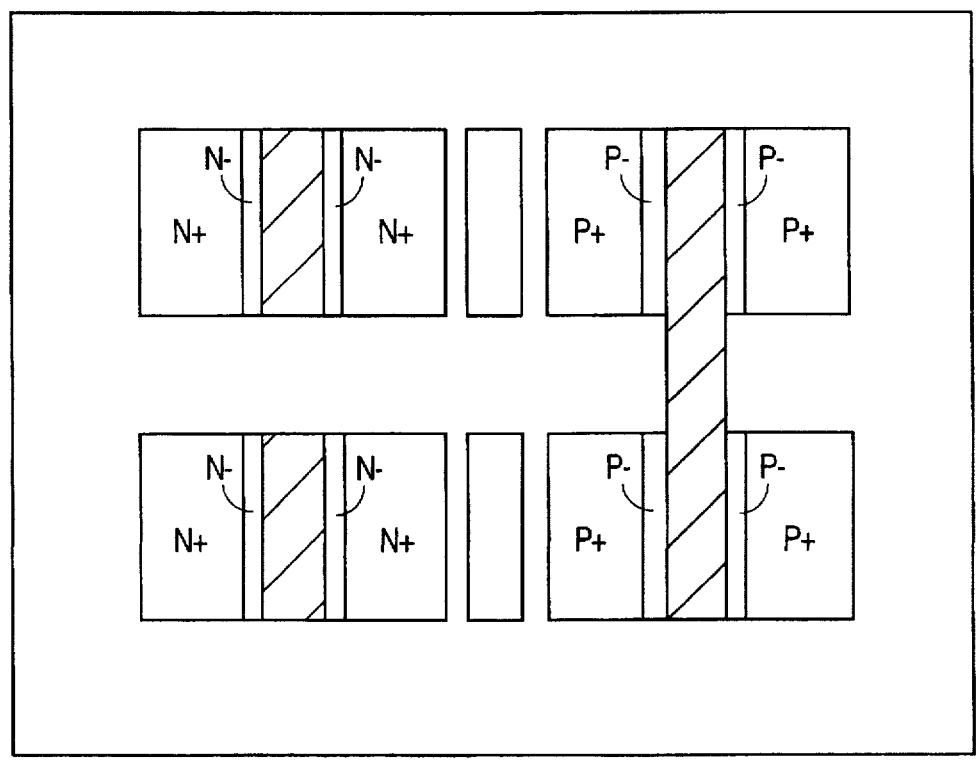

In FIG. 5, the IGFETs in the right-hand side quadrants are N-channel and P-channel devices that provide an inverter circuit. The gate electrodes of these devices are provided by a straight continuous strip of polysilicon which extends across a single y-direction trench.

Figure 6:
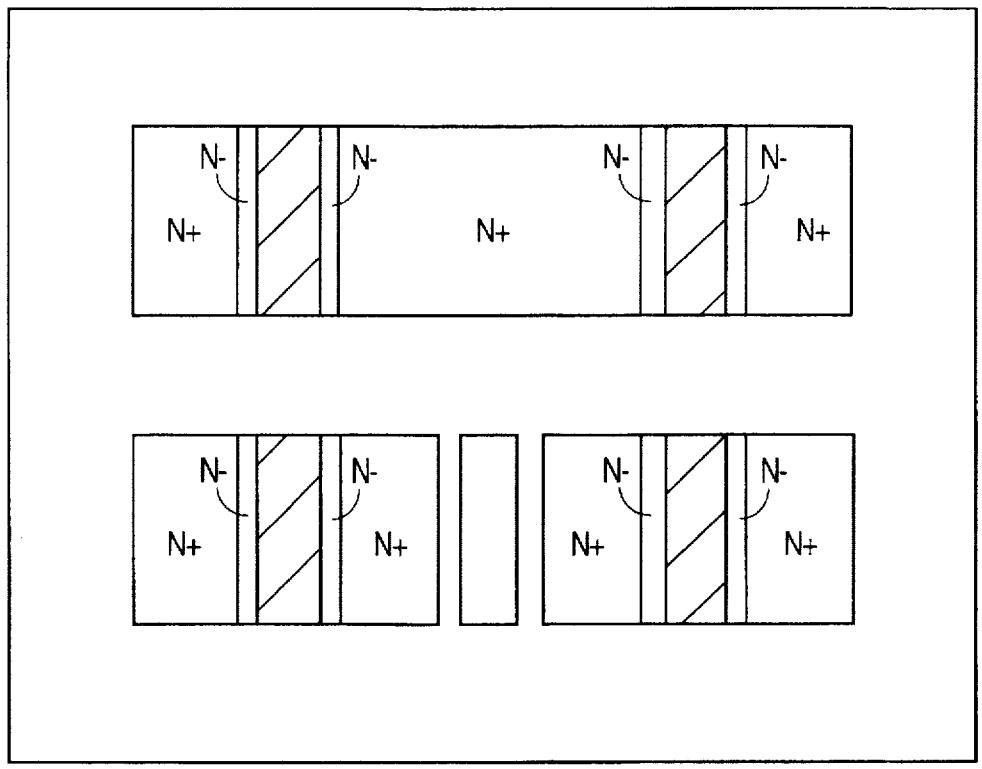

In FIG. 6, the IGFETs in the upper quadrants share a common source/drain region, and the y-direction trench that provides device isolation between the IGFETs in the lower quadrants does not extend between the IGFETs in the upper quadrants.

Figure 7:
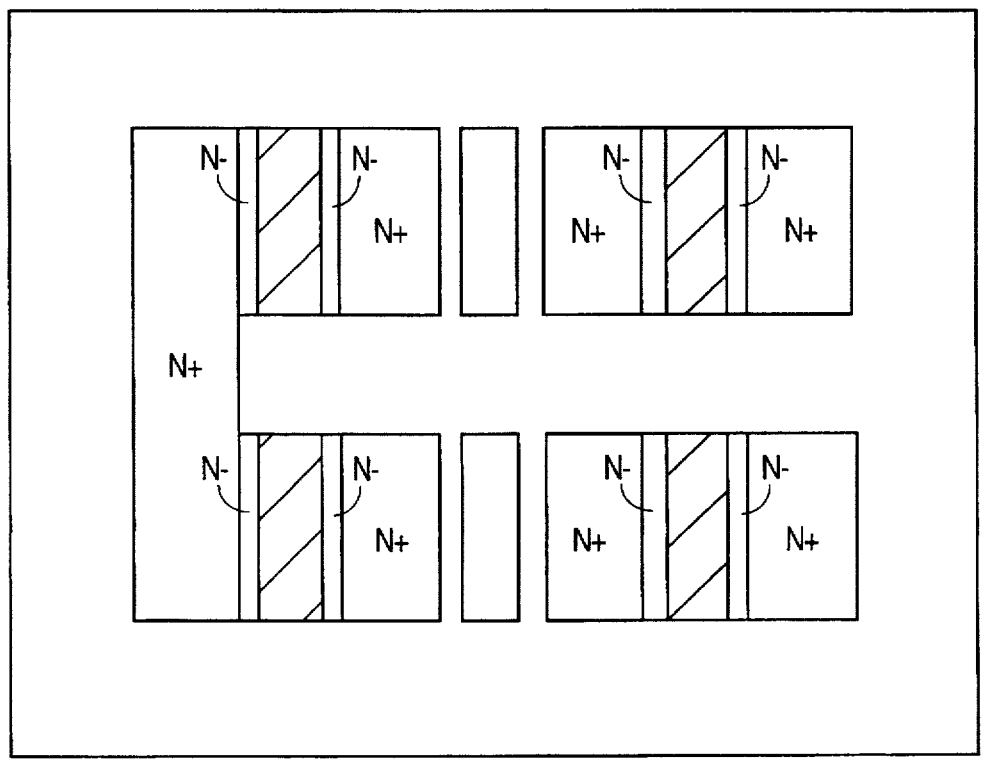

In FIG. 7, the IGFETs in the left-hand quadrants share a common source/drain region, and the x-direction trench that provides device isolation between the IGFETs in the right-hand quadrants does not extend between the common source/drain region.

The invention includes numerous variations to the embodiments described above. For instance, all source/drain doping can be provided before etching the trenches by implanting a doped layer into the substrate, etching the trenches partially through the doped layer, and using the channel implant to counterdope a portion of the doped layer beneath the central portions of the bottom surfaces of the trenches. Likewise, all source/drain doping can be provided after etching the trenches by removing upper portions of the spacers adjacent to the gate electrodes, and implanting heavily doped sidewall source/drain regions through the top surface and lightly doped localized source/drain regions through lower portions of the spacers (which block some but not all of the ions impinging thereon) and through outer portions of the bottom surface beneath the lower portions of the spacers.

The trenches need not necessarily have essentially identical linewidths or depths. Undoped polysilicon can provide an insulator in the isolation trenches. An insulator that replaces the polysilicon in the isolation trenches can be polished down to the gate electrode. The oxide spacers can be removed (partially or entirely) with a dry etch after the gate electrode is formed. The gate electrode can be various conductors such as aluminum, titanium, tungsten, cobalt, and combinations thereof, although the material may be limited by the use of subsequent high-temperature steps. The gate insulator, spacers, and materials in the isolation trenches can be various insulators including silicon dioxide, silicon nitride, and silicon oxynitride. Suitable N-type dopants include arsenic and phosphorus; suitable P-type dopants include boron $B_{10}$, boron $B_{11}$, and $BF_x$ species such as $BF_2$.

Further details regarding trench transistors are disclosed in U.S. application Ser. No. 08/739,593 filed concurrently herewith, entitled "Trench Transistor With Metal Spacers" by Gardner et al.; U.S. application Ser. No. 08/735,595 filed concurrently herewith, entitled "Trench Transistor With Insulative pacers" by Gardner et al.; U.S. application Ser. No. 08/739,592 filed concurrently herewith, entitled "Trench Transistor With Localized Source/Drain Regions Implanted Through Voids In Trench" by Gardner et al.; U.S. application Ser. No. 08/739,596 filed concurrently herewith, entitled "Trench Transistor With Localized Source/Drain Regions Implanted Through Selectively Grown Oxide Layer" by Gardner et al.; U.S. application Ser. No. 08/739,566 filed concurrently herewith, entitled "Trench Transistor And Isolation Trench" by Gardner et al.; and U.S. application Ser. No. 08/739,567 filed concurrently herewith, entitled "Trench Transistor With Source Contact In Trench" by Gardner et al.; the disclosures of which are incorporated herein by reference.

The invention is particularly well-suited for fabricating N-channel MOSFETs, P-channel MOSFETs, and other types of IGFETs in conjunction with trenches arrays, particularly for high-performance microprocessors where high circuit density is essential. Although four IGFETs have been shown for purposes of illustration, it is understood that in actual practice, many devices are fabricated on a single semiconductor wafer as widely practiced in the art. The trench array can have various configurations of x- and y-direction trenches, and each trench need not necessarily be adjacent to an IGFET. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. An IGFET in combination with a trench array, comprising:

a semiconductor substrate including first and second x-direction trenches and first, second and third y-direction trenches generally orthogonal to intersecting with the x-direction trenches, wherein the x-direction trenches and the first and second y-direction trenches surround a first generally rectangular region of the substrate, the x-direction trenches and the second and third y-direction trenches surround a second generally rectangular region of the substrate, and the second y-direction trench is between the first and second substrate regions;

a gate insulator on a bottom surface of the second y-direction trench;

first and second spacers in the second y-direction trench and adjacent to first and second substrate regions, respectively;

a gate electrode on the gate insulator and the spacers and in the second y-direction trench;

a source in the first substrate region and beneath the bottom surface; and a drain in the second substrate region and beneath the bottom surface.

2. The IGFET and trench array of claim 1, wherein all the trenches extend beneath a top surface of the substrate, and the source and the drain extend to the top surface.

3. The IGFET and trench array of claim 2, wherein the source includes a lightly doped region beneath and adjacent to the bottom surface and spaced from the top surface, the source includes a heavily doped region adjacent to the top surface, the drain includes a lightly doped region beneath and adjacent to the bottom surface and spaced from the top surface, and the drain includes and a heavily doped region adjacent to the top surface.

4. The IGFET and trench array of claim 2, wherein all the trenches have essentially identical depths beneath the top surface.

5. The IGFET and trench array of claim 1, wherein the x-direction trenches and the first and third y-direction trenches provides device isolation for the IGFET.

6. The IGFET and trench array of claim 1, wherein the x-direction trenches and the first and third y-direction trenches are filled with an insulator.

7. The IGFET and trench array of claim 1, wherein the gate electrode is electrically isolated from the substrate.

8. The IGFET and trench array of claim 1, wherein the gate electrode is substantially aligned with a top surface of the substrate, the gate electrode does not overlap the top surface, and substantially all of the gate electrode is within the second y-direction trench.

9. The IGFET and trench array of claim 1, wherein the IGFET and trench array are in an integrated circuit chip, and the source and drain are doped N-type.

10. The IGFET and trench array of claim 1, wherein the IGFET and trench array are in an electronic system that includes a microprocessor, a memory and a system bus, and the source and drain are doped N-type.

11. An IGFET in combination with a trench array, comprising:

a semiconductor substrate doped a first conductivity type, the semiconductor substrate including first and second isolation trenches in parallel with one another, third and fourth isolation trenches in parallel with one another and orthogonal to and intersecting with the first and second isolation trenches, and a transistor trench parallel to and between the third and fourth isolation trenches and orthogonal to and intersecting with the first and second isolation trenches, wherein all the trenches extend beneath a top surface of the substrate;

a first rectangular region of the substrate with first, second, third and fourth sidewalls defined by the first isolation trench, the transistor trench, the second isolation trench, and the third isolation trench, respectively;

a second generally rectangular region of the substrate with first, second, third and fourth sidewalls defined by the first isolation trench, the transistor trench, the second isolation trench, and the fourth isolation trench, respectively;

wherein a single sidewall of the first isolation trench provides the first sidewalls, opposing sidewalls of the transistor trench provide the second sidewalls, a single sidewall of the second isolation trench provides the third sidewalls, a single sidewall of the third isolation trench provides the fourth sidewall of the first substrate region, a single sidewall of the fourth isolation trench provides the fourth sidewall of the second substrate region, and the transistor trench is between the first and second substrate regions;

a gate insulator on a central portion of a bottom surface of the transistor trench;

first and second insulative spacers on outer portions of the bottom surface, wherein the first spacer is adjacent to the second sidewall of the first substrate region, the second spacer is adjacent to the second sidewall of the second substrate region, and the central portion of the bottom surface is between the first and second spacers;

a gate electrode in the transistor trench and adjacent to the gate insulator and the first and second spacers, wherein the gate electrode is spaced from and electrically isolated from the substrate;

a source doped a second conductivity type in the first substrate region and outside the second substrate region, wherein the source is adjacent to the top surface and the second sidewall of the first substrate region provides a first channel junction beneath and adjacent to the bottom surface; and a drain doped the second conductivity type in the second substrate region and outside the first substrate region, wherein the drain is adjacent to the top surface and the second sidewall of the second substrate region and provides a second channel junction beneath and adjacent to the bottom surface.

12. The IGFET and trench array of claim 11, wherein all the trenches have essentially identical depths beneath the top surface.

13. The IGFET and trench array of claim 11, wherein all the trenches have essentially identical linewidths.

14. The IGFET and trench array of claim 11, wherein the first and second substrate regions have essentially identical sizes.

15. The IGFET and trench array of claim 11, wherein a lightly doped region of the source is spaced from the top surface and provides the first channel junction, a lightly doped region of the drain is spaced from the top surface and provides the second channel junction, a heavily doped region of the source is spaced from the first channel junction and adjacent to the first sidewall and the top surface, and a heavily doped region of the drain is spaced from the second channel junction and adjacent to the second sidewall and the top surface.

16. The IGFET and trench array of claim 11, wherein the first and second junctions define a channel beneath and adjacent to the bottom surface, and a length of the channel is less than half of a length between the second sidewalls.

17. The IGFET and trench array of claim 11, wherein the first, second, third and fourth trenches are filled with an insulator.

18. The IGFET and trench array of claim 11, wherein the first, second, third and fourth trenches provide device isolation for the IGFET.

19. The IGFET and trench array of claim 11, wherein the gate electrode does not overlap the top surface, and substantially all of the gate electrode is within the transistor trench.

20. The IGFET and trench array of claim 11, wherein the gate electrode is polysilicon, the gate insulator is selected from the group consisting of silicon dioxide, silicon nitride and silicon oxynitride, and the spacers are selected from the group consisting of silicon dioxide, silicon nitride and silicon oxynitride.

21. A plurality of IGFETs in combination with a trench array, comprising:

a semiconductor substrate including first, second and third x-direction trenches and first, second, third and fourth y-direction trenches generally orthogonal to all the x-direction trenches, wherein the second x-direction trench is between the first and third x-direction trenches, the second y-direction trench is between the first and third y-direction trenches, the third y-direction trench is between the second and fourth y-direction trenches, the first and third x-direction trenches intersect all the y-direction trenches, the second x-direction trench intersects at least the second and third y-direction trenches, and all the trenches have essentially identical depths beneath a top surface of the substrate;

a first IGFET including a first gate insulator on a portion of a bottom surface of the second y-direction trench between the first and second x-direction trenches, first spacers on opposing sidewalls of the second y-direction trench between the first and second x-direction trenches, a first gate electrode on the first gate insulator and the first spacers and in the second y-direction trench between the first and second x-direction trenches, a first source in the substrate and adjacent to the top surface and beneath the first gate insulator, and a first drain in the substrate and adjacent to the top surface and beneath the first gate insulator;

a second IGFET including a second gate insulator on a portion of a bottom surface of the third y-direction trench between the first and second x-direction trenches, second spacers on opposing sidewalls of the third y-direction trench between the first and second x-direction trenches, a second gate electrode on the second gate insulator and the second spacers and in the third y-direction trench between the first and second x-direction trenches, a second source in the substrate and adjacent to the top surface and beneath the second gate insulator, and a second drain in the substrate and adjacent to the top surface and beneath the second gate insulator;

a third IGFET including a third gate insulator on a portion of the bottom surface of the second y-direction trench between the second and third x-direction trenches, third spacers on opposing sidewalls of the second y-direction trench between the second and third x-direction trenches, a third gate electrode on the third gate insulator and the third spacers and in the second y-direction trench between the second and third x-direction trenches, a third source in the substrate and adjacent to the top surface and beneath the third gate insulator, and a third drain in the substrate and adjacent to the top surface and beneath the third gate insulator; and a fourth IGFET including a fourth gate insulator on a portion of the bottom surface of the third y-direction trench between the second and third x-direction trenches, fourth spacers on opposing sidewalls of the third y-direction trench between the second and third x-direction trenches, a fourth gate electrode on the fourth gate insulator and the fourth spacers and in the third y-direction trench between the second and third x-direction trenches, a fourth source in the substrate and adjacent to the top surface and beneath the fourth gate insulator, and a fourth drain in the substrate and adjacent to the top surface and beneath the fourth gate insulator.

22. The IGFETs and trench array of claim 21, wherein a continuous strip of polysilicon in the third x-direction trench between the second and third y-direction trench provides the third and fourth gate electrodes.

23. The IGFETs and trench array of claim 21, wherein a continuous strip of polysilicon in the third y-direction trench provides the second and fourth gate electrodes.

24. The IGFETs and trench array of claim 21, wherein a rectangular region of the substrate between and adjacent to the first and second x-direction trenches and the second and third y-direction trenches is doped a single conductivity type and includes one of the first source and first drain and one of the second source and second drain.

25. The IGFETs and trench array of claim 21, wherein a rectangular region of the substrate between and adjacent to the first and third x-direction trenches and the first and second y-direction trenches is doped a single conductivity type and includes one of the first source and first drain and one of the third source and third drain.

* * * * *